US012727351B2

(12) United States Patent
Kim et al.

(10) Patent No.: US 12,727,351 B2
(45) Date of Patent: Sep. 1, 2026

(54) DISPLAY APPARATUS AND ELECTRONIC DEVICE INCLUDING THE SAME

(71) Applicant: Samsung Display Co., Ltd., Yongin-si (KR)

(72) Inventors: Minjeong Kim, Yongin-si (KR); Kyeonghwa Kim, Yongin-si (KR); Seungyeon Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/283,035

(22) Filed: Jul. 28, 2025

(65) Prior Publication Data

US 2026/0033189 A1 Jan. 29, 2026

(30) Foreign Application Priority Data

Jul. 29, 2024 (KR) ........................ 10-2024-0100543

(51) Int. Cl.
*H10K 59/131* (2023.01)
*G09G 3/3233* (2016.01)

(52) U.S. Cl.
CPC ......... *H10K 59/131* (2023.02); *G09G 3/3233* (2013.01); *G09G 2300/0819* (2013.01); *G09G 2300/0842* (2013.01); *G09G 2300/0861* (2013.01); *G09G 2320/0242* (2013.01); *G09G 2330/08* (2013.01); *G09G 2354/00* (2013.01)

(58) Field of Classification Search
CPC ............... H10K 59/131; H10K 71/861; H10K 59/1213; H10K 59/1216; G09G 3/3233; G09G 2300/0819; G09G 2300/0842; G09G 2300/0861; G09G 2320/0242; G09G 2330/08; G09G 2354/00; G09G 3/006
See application file for complete search history.

(56) References Cited

U.S. PATENT DOCUMENTS 9,583,542 B2 2/2017 Park et al.
9,754,532 B2 9/2017 Park et al.
(Continued)

FOREIGN PATENT DOCUMENTS

KR 10-2145850 B1 12/2015
KR 10-2150022 B1 9/2020
(Continued)

*Primary Examiner* — Dmitriy Bolotin
(74) *Attorney, Agent, or Firm* — Womble Bond Dickinson (US) LLP

(57) ABSTRACT

A display apparatus includes a display area including a round corner portion, a peripheral area including a first side peripheral area, a second side peripheral area, and a corner peripheral area located between the first side peripheral area and the second side peripheral area, the peripheral area surrounding the display area, a first repair circuit in the first side peripheral area, a second repair circuit in the round corner peripheral area, and first and second light-emitting diode initialization voltage lines, wherein the first light-emitting diode initialization voltage line extends from the display area to the first side peripheral area and is electrically connectable to a transistor of the first repair circuit, and the second light-emitting diode initialization voltage line extends from the display area to the first side peripheral area and is electrically connectable to the transistor of the first repair circuit.

20 Claims, 14 Drawing Sheets

(56) References Cited

U.S. PATENT DOCUMENTS 11,670,644 B2 * 6/2023 Kim ..................... G09G 3/3233
345/205
11,908,377 B2 2/2024 In et al.
2010/0201902 A1 * 8/2010 Hsu ................... G02F 1/136259
445/2
2015/0348466 A1 * 12/2015 Park ..................... G09G 3/3233
345/82
2016/0035279 A1 * 2/2016 Park ..................... G09G 3/3233
345/212
2017/0316737 A1 * 11/2017 Park ..................... G09G 3/3208
2021/0272985 A1 * 9/2021 Kim ..................... G09G 3/3233
2022/0293695 A1 * 9/2022 Jo ........................... G09G 3/32
2023/0171997 A1 * 6/2023 Choi .................... H10K 71/861
257/40
2024/0054927 A1 * 2/2024 Park ....................... G09G 3/006
2024/0224771 A1 * 7/2024 Kim ..................... H10K 71/861
2024/0321208 A1 * 9/2024 Lee ...................... G09G 3/3233
2024/0355269 A1 * 10/2024 Kim ......................... G09G 3/32
2024/0373692 A1 * 11/2024 Park ..................... H10K 71/861
2025/0311566 A1 * 10/2025 Cho ..................... H10K 59/131
2025/0316220 A1 * 10/2025 Park ....................... G09G 3/006
2025/0318375 A1 * 10/2025 Kim ..................... H10K 59/131
2025/0349255 A1 * 11/2025 Lim ..................... G09G 3/3233

FOREIGN PATENT DOCUMENTS

KR 10-2285390 B1 8/2021
KR 10-2023-0030104 A 3/2023
KR 10-2023-0078875 A 6/2023

* cited by examiner

ELVDD
PL
EM
EML
PXb
PXg
PXr
T1
T2
T3
T4
T5
T6
T7
Cst
Vint
VL1
GB
GBL
Vaint1
Vaint2
Vaint3
VL2a
VL2b
VL2c
PC1
PC2
PC3
LED1
LED2
LED3
ELVSS
DL1
DL2
DL3
Data
GW
GWL
GI
GIL
RL
○ : CONNECTABLE PORTION

FIG. 4A

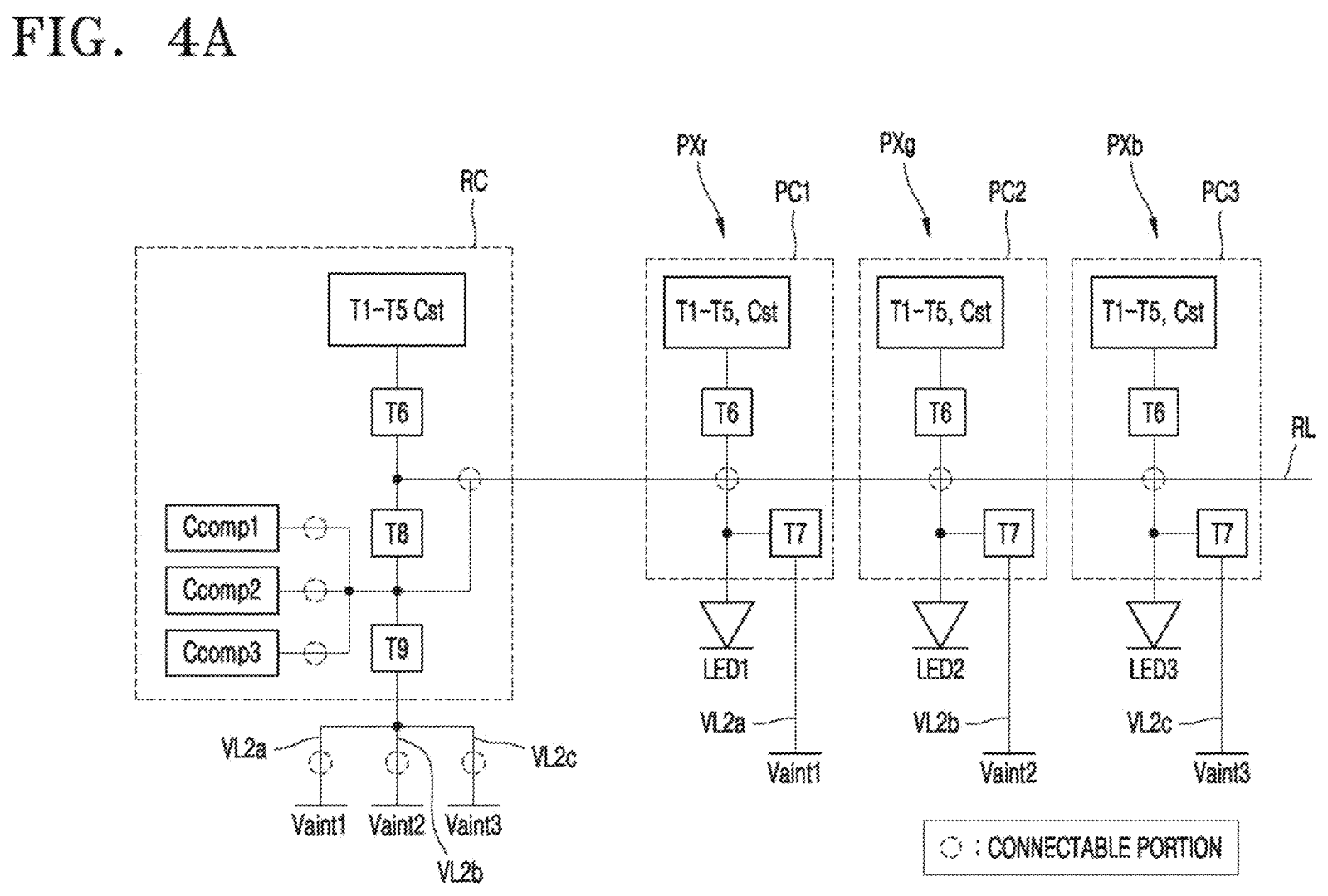

RL
PXb
PC3
T1~T5, Cst
T6
T7
LED3
VL2c
Vaint3
PXg
PC2
T1~T5, Cst
T6
T7
LED2
VL2b
Vaint2
PXr
PC1
T1~T5, Cst
T6
T7
LED1
VL2a
Vaint1
○ : CONNECTABLE PORTION
RC
T1~T5 Cst
T6
T8
T9
Ccomp1
Ccomp2
Ccomp3
VL2c
VL2b
VL2a
Vaint3
Vaint2
Vaint1

1
WL
DA
CN
TL1 TL2 TL3
RC2
VSL3 VSL2 VSL1
SPA2
CPA
⊗ : CNT
x
y
z

FIG. 7A

DISPLAY APPARATUS AND ELECTRONIC DEVICE INCLUDING THE SAME

CROSS-REFERENCE TO RELATED APPLICATION

The application claims priority to and the benefit of Korean Patent Application No. 10-2024-0100543, filed on Jul. 29, 2024, in the Korean Intellectual Property Office, the entire disclosure of which is incorporated herein by reference.

BACKGROUND

1. Field

Aspects of embodiments of the present disclosure relate to a display apparatus.

2. Description of the Related Art

A display apparatus may include a plurality of pixels, which are basic units for realizing an image. Each of the plurality of pixels may include a light-emitting diode and a pixel circuit. The light-emitting diode may emit light based on a driving current transmitted from the pixel circuit.

In a manufacturing process of the display apparatus, defects may occur in a pixel circuit of a certain pixel. Thus, a display apparatus may include a repair circuit configured to provide a driving current to a light-emitting diode, rather than a pixel circuit in which defects have occurred, in order to have improved quality.

The above information disclosed in this Background section is only for enhancement of understanding of the background of the invention and therefore it may contain information that does not form the prior art.

SUMMARY

Aspects of some embodiments of the present disclosure are directed to a display apparatus, in which a pixel in which defects have occurred may be repaired to operate normally, and display quality is improved by reducing color deviation between pixels.

Aspects of the present disclosure are not limited thereto. Other aspects that are not mentioned herein would be clearly understood by one of ordinary skill in the art based on the description of the disclosure.

Additional aspects will be set forth in part in the description which follows and, in part, will be apparent from the description, or may be learned by practice of the presented embodiments of the disclosure.

According to some embodiments of the disclosure, there is provided a display apparatus including: a display area including a round corner portion and in which a plurality of pixels, each including a pixel circuit and a light-emitting diode, are arranged; a peripheral area including a first side peripheral area adjacent to the display area in a first direction, a second side peripheral area adjacent to the display area in a second direction crossing the first direction, and a corner peripheral area located between the first side peripheral area and the second side peripheral area and adjacent to the round corner portion of the display area, the peripheral area surrounding the display area; a first repair circuit arranged in the first side peripheral area and a second repair circuit arranged in the corner peripheral area; a first light-emitting diode initialization voltage line extending in the first direction in the display area and configured to transmit a first light-emitting diode initialization voltage to each of the plurality of pixels; and a second light-emitting diode initialization voltage line extending in the first direction in the display area and configured to transmit a second light-emitting diode initialization voltage to each of the plurality of pixels, wherein the first light-emitting diode initialization voltage line extends from the display area to the first side peripheral area and is electrically connectable to a transistor of the first repair circuit, and wherein the second light-emitting diode initialization voltage line extends from the display area to the first side peripheral area and is electrically connectable to the transistor of the first repair circuit.

In some embodiments, the display apparatus may further include a first connection pattern connected to the transistor of the first repair circuit, and each of the first light-emitting diode initialization voltage line and the second light-emitting diode initialization voltage line may be arranged to overlap with the first connection pattern to be connectable to the first connection pattern.

In some embodiments, the first light-emitting diode initialization voltage line may be at a different layer from the second light-emitting diode initialization voltage line.

In some embodiments, the first connection pattern may be at a different layer from each of the first light-emitting diode initialization voltage line and the second light-emitting diode initialization voltage line.

In some embodiments, the first repair circuit may include a first compensation capacitor and a second compensation capacitor that are electrically connectable to the transistor of the first repair circuit.

In some embodiments, the display apparatus may further include: a second connection pattern connected to the transistor of the first repair circuit; a third connection pattern arranged to overlap with the second connection pattern to be connectable to the second connection pattern, the third connection pattern being connected to the first compensation capacitor; and a fourth connection pattern arranged to overlap with the second connection pattern to be connectable to the second connection pattern, the fourth connection pattern being connected to the second compensation capacitor.

In some embodiments, the display apparatus may further include a driving voltage transmission line configured to transmit a driving voltage to each of the plurality of pixels, and each of the first compensation capacitor and the second compensation capacitor may be electrically connectable to the driving voltage transmission line.

In some embodiments, the display apparatus may further include: a fifth connection pattern connected to the driving voltage transmission line; a sixth connection pattern arranged to overlap with the fifth connection pattern to be connectable to the fifth connection pattern, the sixth connection pattern being connected to the first compensation capacitor; and a seventh connection pattern arranged to overlap with the fifth connection pattern to be connectable to the fifth connection pattern, the seventh connection pattern being connected to the second compensation capacitor.

In some embodiments, the display apparatus may further include: a first light-emitting diode initialization voltage supply line, at least a portion of which may be arranged in the second side peripheral area; a first transmission line electrically connected to the first light-emitting diode initialization voltage supply line, arranged in the corner peripheral area, and electrically connectable to a transistor of the second repair circuit; a second light-emitting diode initialization voltage supply line, at least a portion of which may be arranged in the second side peripheral area; and a second transmission line electrically connected to the second light-emitting diode initialization voltage supply line, arranged in the corner peripheral area, and electrically connectable to the transistor of the second repair circuit.

In some embodiments, the display apparatus may further include: a first connection line electrically connected to the first transmission line; a second connection line electrically connected to the second transmission line; and an eighth connection pattern connected to the transistor of the second repair circuit and overlapping with each of the first connection line and the second connection line to be electrically connectable to each of the first connection line and the second connection line.

In some embodiments, the display apparatus may further include: a first light-emitting diode initialization voltage supply line, at least a portion of which may be arranged in the second side peripheral area; a first transmission line electrically connected to the first light-emitting diode initialization voltage supply line, arranged in the corner peripheral area, and electrically connected to a transistor of the second repair circuit; and a second light-emitting diode initialization voltage supply line, at least a portion of which may be arranged in the second side peripheral area and supplying a second light-emitting diode initialization voltage to each of the plurality of pixels, and the second light-emitting diode initialization voltage supply line may be electrically connectable to the first light-emitting diode initialization voltage supply line.

In some embodiments, the display apparatus may further include: a first connection line electrically connecting the first transmission line to the transistor of the second repair circuit; and a ninth connection pattern connected to the second light-emitting diode initialization voltage supply line and arranged to overlap with the first light-emitting diode initialization voltage supply line to be connectable to the first light-emitting diode initialization voltage supply line.

According to some embodiments of the present disclosure, there is provided a display apparatus including: a display area in which a plurality of pixels each including a pixel circuit and a light-emitting diode are arranged; a peripheral area surrounding the display area; a repair circuit arranged in the peripheral area; a first light-emitting diode initialization voltage line extending in a first direction in the display area and configured to transmit a first light-emitting diode initialization voltage to each of the plurality of pixels; and a second light-emitting diode initialization voltage line extending in the first direction in the display area and configured to transmit a second light-emitting diode initialization voltage to each of the plurality of pixels. The first light-emitting diode initialization voltage line extends from the display area to the peripheral area and is electrically connectable to a transistor of the repair circuit, and the second light-emitting diode initialization voltage line extends from the display area to the peripheral area and is connectable to the transistor of the repair circuit.

In some embodiments, the display apparatus may further include a first connection pattern arranged in the peripheral area and connected to the transistor of the repair circuit, and each of the first light-emitting diode initialization voltage line and the second light-emitting diode initialization voltage line may be arranged to overlap with the first connection pattern to be connectable to the first connection pattern.

In some embodiments, the first light-emitting diode initialization voltage line may be on a different layer from the second light-emitting diode initialization voltage line.

In some embodiments, the first connection pattern may be on a different layer from each of the first light-emitting diode initialization voltage line and the second light-emitting diode initialization voltage line.

In some embodiments, the repair circuit may further include a first compensation capacitor and a second compensation capacitor that are electrically connectable to the transistor of the repair circuit.

In some embodiments, the display apparatus may further include: a second connection pattern connected to the transistor of the repair circuit; a third connection pattern arranged to overlap with the second connection pattern to be connectable to the second connection pattern, the third connection pattern being connected to the first compensation capacitor; and a fourth connection pattern arranged to overlap with the second connection pattern to be connectable to the second connection pattern, the fourth connection pattern being connected to the second compensation capacitor.

In some embodiments, the display apparatus may further include a driving voltage transmission line extending in the first direction and configured to transmit a driving voltage to each of the plurality of pixels, and each of the first compensation capacitor and the second compensation capacitor may be electrically connectable to the driving voltage transmission line.

In some embodiments, the display apparatus may further include: a fifth connection pattern connected to the driving voltage transmission line; a sixth connection pattern arranged to overlap with the fifth connection pattern to be connectable to the fifth connection pattern, the sixth connection pattern being connected to the first compensation capacitor; and a seventh connection pattern arranged to overlap with the fifth connection pattern to connectable to the fifth connection pattern, the seventh connection pattern being connected to the second compensation capacitor.

According to some embodiments of the disclosure, there is provided an electronic device including: an input module configured to receive input data from a user; a memory configured to store the input data; a processor configured to perform computations based on the input data and provide output data; and a display apparatus configured to display an image to the user based, in part, on the input data and the output data, the display apparatus including: a display area including a round corner portion and in which a plurality of pixels, each including a pixel circuit and a light-emitting diode, are arranged; a peripheral area including a first side peripheral area adjacent to the display area in a first direction, a second side peripheral area adjacent to the display area in a second direction crossing the first direction, and a corner peripheral area located between the first side peripheral area and the second side peripheral area and adjacent to the round corner portion of the display area, the peripheral area surrounding the display area; a first repair circuit arranged in the first side peripheral area and a second repair circuit arranged in the corner peripheral area; a first light-emitting diode initialization voltage line extending in the first direction in the display area and configured to transmit a first light-emitting diode initialization voltage to each of the plurality of pixels; and a second light-emitting diode initialization voltage line extending in the first direction in the display area and configured to transmit a second light-emitting diode initialization voltage to each of the plurality of pixels, wherein the first light-emitting diode initialization voltage line extends from the display area to the first side peripheral area and is electrically connectable to a transistor of the first repair circuit, and wherein the second light-emitting diode initialization voltage line extends from the display area to the first side peripheral area and is electrically connectable to the transistor of the first repair circuit.

In some embodiments, the electronic device may be a smartphone.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 4A to 4D are views to describe a method of repairing a pixel in which a defect has occurred according to some embodiments of the present disclosure;

FIG. 5 is a schematic plan view of a first side peripheral area and a display area of a display apparatus according to some embodiments of the present disclosure;

FIG. 6A is a schematic plan view of a second side peripheral area and a corner peripheral area of a display apparatus according to some embodiments of the present disclosure;

FIG. 7A is a schematic plan view of a second side peripheral area and a corner peripheral area of a display apparatus according to some embodiments of the present disclosure;

DETAILED DESCRIPTION

Figure 1:
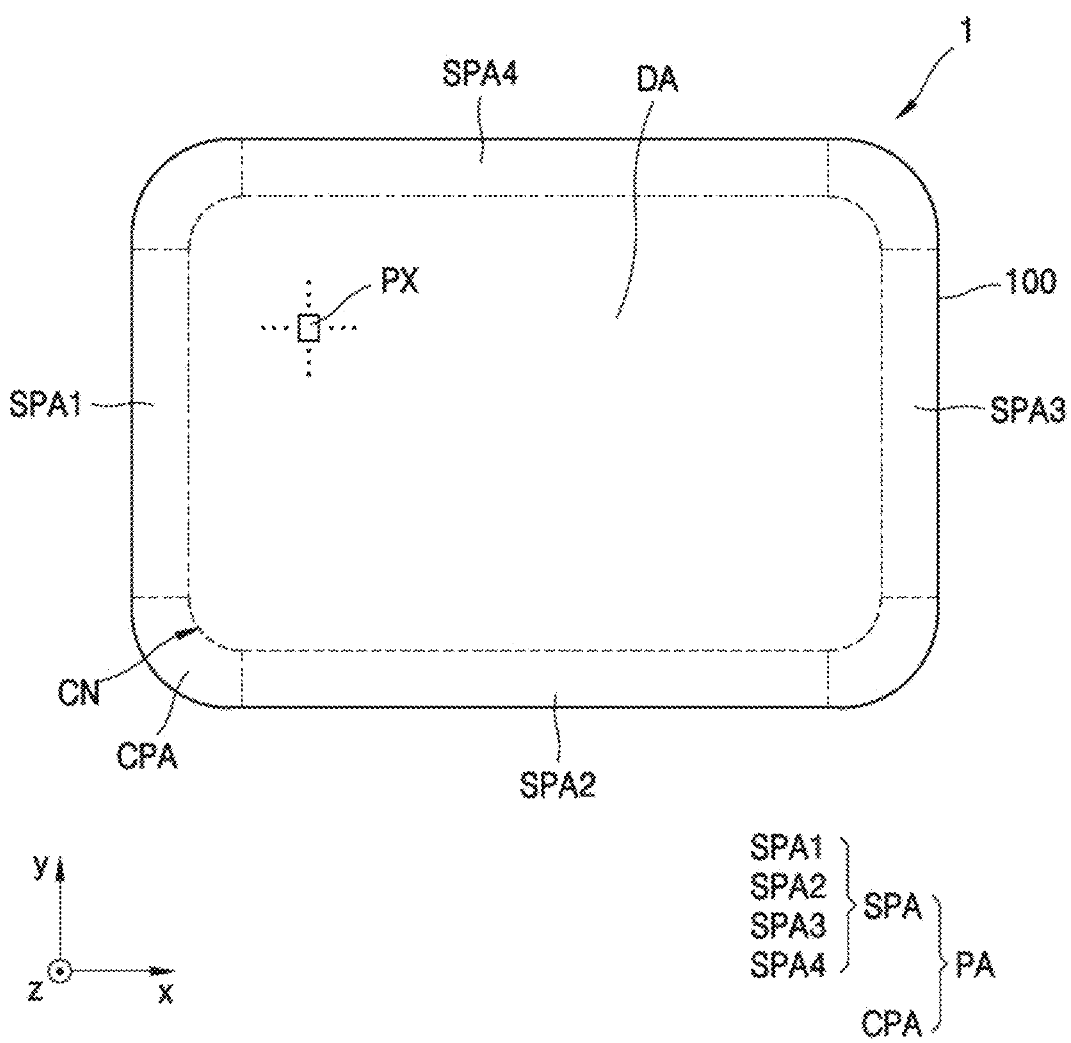
FIG. 1 is a schematic view of a display apparatus according to some embodiments of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected to the other layer, area, or element with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or some specification, and should not be interpreted in an idealized or overly formal sense, unless expressly so defined herein.

FIG. 1 is a schematic view of a display apparatus 1 according to some embodiments of the present disclosure.

The display apparatus 1 may include, as a display element, a light-emitting diode. The display apparatus 1 may be used as a display screen of not only portable electronic devices, such as a mobile phone, a smartphone, a tablet personal computer (PC), a mobile communication terminal, an electronic notebook, an electronic book, a portable multimedia player (PMP), a navigation device, an ultra-mobile PC (UMPC), etc., but also of various products, such as a television, a notebook computer, a monitor, an advertising board, an Internet of things (IOT) device, etc. Also, the display apparatus 1 according to some embodiments may be used in wearable devices, such as a smart watch, a watch phone, a glasses-type display, and a head-mounted display (HMD). Also, the display apparatus 1 according to some embodiments may be used as: a center information display (CID) on a gauge of a vehicle or a center fascia or a dashboard of the vehicle; a room mirror display substituting a side-view mirror of a vehicle; or a display screen disposed on a rear surface of a front seat, as an entertainment device for a backseat of a vehicle.

Referring to FIG. 1, the display apparatus 1 may include a display area DA and a peripheral area PA outside the display area DA. The shape of the display apparatus 1 of FIG. 1 may be substantially the same as the shape of a substrate 100. For example, that the display apparatus 1 may include the display area DA and the peripheral area PA may denote that the substrate 100 may include the display area DA and the peripheral area PA.

The display apparatus 1 may provide an image through an array of a plurality of pixels PX two-dimensionally arranged in the display area DA. For example, the plurality of pixels PX may be arranged in a plurality of rows and a plurality of columns. The pixel PX may include a pixel circuit and a display element. The pixel PX may be defined as an emission area, in which the display element driven by the pixel circuit emits light. For example, an image may be provided by the light emitted by the display element through the pixel PX. Since an area providing an image is determined by an arrangement of a plurality of display elements, the display area DA may be defined by the plurality of display elements.

The display area DA may include a corner portion CN having a round edge having a certain curvature. According to some embodiments, the display area DA may have a shape including a rectangular round corner in a plan view. For example, the display area DA may include four corner portions CN located at four side surfaces and between the side surfaces adjacent to each other, and the corner portion CN may have a round edge. For example, the display area DA may include the round corner portion CN between a side surface extending in a first direction (e.g., an x direction) and a side surface extending in a second direction (e.g., a y direction) perpendicular to the first direction.

The display apparatus 1 may have a long side in the first direction (e.g., the x direction or a −x direction) and a short side in the second direction (e.g., the y direction or a −y direction). According to some other embodiments, the display apparatus 1 may have a side in the first direction (e.g., the x direction or the −x direction) and a side in the second direction (e.g., the y direction or the −y direction), the side in the first direction and the side in the second direction having the about same length as each other. According to some other embodiments, the display apparatus 1 may have a short side in the first direction (e.g., the x direction or the −x direction) and a long side in the second direction (e.g., the y direction or the −y direction).

The peripheral area PA may be an area not providing an image and the pixel PX may not be arranged in the peripheral area PA. For example, the peripheral area PA may be a non-display area in which an image is not displayed. The peripheral area PA may be arranged outside the display area DA and may be referred to as an outer area. The peripheral area PA may surround the display area DA. A driver, etc. configured to provide an electrical signal or power to the display area DA may be arranged in the peripheral area PA.

The peripheral area PA may include first to fourth side peripheral areas SPA1, SPA2, SPA3, and SPA4 arranged at the side surfaces of the display area DA, respectively. The first side peripheral area SPA1 and the third side peripheral area SPA3 may be arranged at both sides of the display area DA with the display area DA therebetween, and each of the first side peripheral area SPA1 and the third side peripheral area SPA3 may extend in the second direction (e.g., the y direction). The second side peripheral area SPA2 and the fourth side peripheral area SPA4 may be arranged at both sides of the display area DA with the display area DA therebetween, and each of the second side peripheral area SPA2 and the fourth side peripheral area SPA4 may extend in the first direction (e.g., the x direction).

The peripheral area PA may include a corner peripheral area CPA located at a corner of the display apparatus 1 and having an edge having a certain curvature (e.g., a round edge). According to some embodiments, the corner peripheral area CPA may be located to be adjacent to each of the four corner portions CN of the display area DA. According to some embodiments, the peripheral area PA may include four corner peripheral areas CPA. The corner peripheral area CPA may be located between the side peripheral areas SPA adjacent to each other. For example, each corner peripheral area CPA may be located between the first side peripheral area SPA1 and the second side peripheral area SPA2, between the first side peripheral area SPA1 and the fourth side peripheral area SPA4, between the second side peripheral area SPA2 and the third side peripheral area SPA3, or between the third side peripheral area SPA3 and the fourth side peripheral area SPA4. The corner peripheral area CPA may connect the side peripheral areas SPA adjacent to each other. For example, the corner peripheral area CPA may connect the first side peripheral area SPA1 with the second side peripheral area SPA2.

A repair circuit RC (see, e.g., FIG. 3B) to be described below may be arranged in the peripheral area PA. According to some embodiments, the repair circuit RC may include a first repair circuit RC1 (see, e.g., FIG. 5) and a second repair circuit RC2 (see, e.g., FIGS. 6A and 6B).

According to some embodiments, the first repair circuit RC1 (see, e.g., FIG. 5) may be arranged in the peripheral area PA arranged at the left side and/or the right side of the display area DA. For example, the first repair circuit RC1 (see, e.g., FIG. 5) may be arranged in the first side peripheral area SPA1 and/or the third side peripheral area SPA3. According to some embodiments, the first repair circuit RC1 (see, e.g., FIG. 5) may be arranged in the peripheral area PA arranged at the upper side and/or the lower side of the display area DA. For example, the first repair circuit RC1 may be arranged in the second side peripheral area SPA2 and/or the fourth side peripheral area SPA4. According to some embodiments, the second repair circuit RC2 (see, e.g., FIGS. 6A and 6B) may be arranged in the corner peripheral area CPA.

Figure 2:
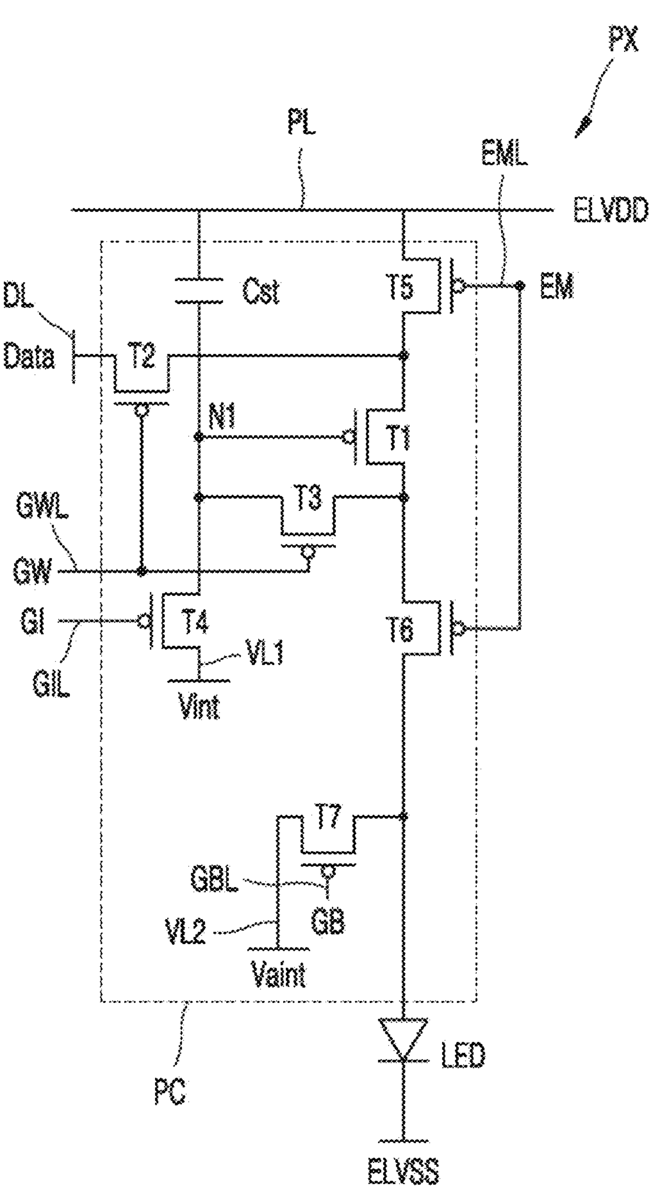
FIG. 2 is an equivalent circuit diagram of a pixel circuit of a pixel, according to some embodiments of the present disclosure.

FIG. 2 is an equivalent circuit diagram of a pixel circuit PC of a pixel PX, according to some embodiments of the present disclosure.

Referring to FIG. 2, the pixel PX may be connected to a scan line GWL, an initialization control line GIL, a light-emitting diode initialization control line GBL, and an emission control line EML and may receive a scan signal GW, an initialization control signal GI, a light-emitting diode initialization control signal GB, and an emission control signal EM, respectively. The pixel PX may receive a data signal Data through a data line DL.

The pixel PX of a display apparatus 1 according to some embodiments may include the pixel circuit PC and may include, as a display element, a light-emitting diode LED connected to the pixel circuit PC and emitting light. The light-emitting diode LED may include a pixel electrode (e.g., an anode), an opposite electrode (e.g., a cathode), and an emission layer between the anode and the cathode.

The light-emitting diode LED according to some embodiments may include an organic light-emitting diode including an organic emission layer. For example, the display apparatus 1 (see, e.g., FIG. 1) may include an organic light-emitting display apparatus including an organic light-emitting diode. However, the display apparatus 1 according to the disclosure is not limited thereto. According to some embodiments, the display apparatus 1 according to the disclosure may include an inorganic light-emitting display apparatus, an inorganic electroluminescent (EL) display apparatus, or a quantum dot light-emitting display apparatus. For example, the emission layer of the light-emitting diode LED included in the display apparatus 1 may include an organic material or an inorganic material. Also, the display apparatus 1 may include the emission layer and quantum-dots layer located on a path of the light emitted from the emission layer.

The pixel circuit PC may include a plurality of transistors T1, T2, T3, T4, T5, T6, and T7 and a storage capacitance element. The plurality of transistors T1 to T7 may include a first transistor T1, a second transistor T2, a third transistor T3, a fourth transistor T4, a fifth transistor T5, a sixth transistor T6, and a seventh transistor T7. The storage capacitance element may include a capacitor, and in this specification, the storage capacitance element may be represented as a storage capacitor Cst.

The first transistor T1 may be connected between a driving voltage line PL configured to receive a driving voltage ELVDD and the light-emitting diode LED. A gate electrode of the first transistor T1 may be connected to an end of the storage capacitor Cst. The gate electrode of the first transistor T1 may be connected to a first node N1. A source electrode of the first transistor T1 may be connected to the driving voltage line PL through the fifth transistor T5. A drain electrode of the first transistor T1 may be electrically connected to the pixel electrode (e.g., the anode) of the light-emitting diode LED through the sixth transistor T6. The first transistor T1 may supply a driving current to the light-emitting diode LED by receiving the data signal Data transmitted by the data line DL, according to a switching operation of the second transistor T2. The first transistor T1 may be referred to as a driving transistor.

A gate electrode of the second transistor T2 may be connected to the scan line GWL. A first electrode of the second transistor T2 may be connected to the data line DL and a second electrode of the second transistor T2 may be connected to the source electrode of the first transistor T1. The second transistor T2 may be turned on according to the scan signal GW received through the scan line GWL and may transmit the data signal Data transmitted through the data line DL to the source electrode of the first transistor T1, and the data signal Data may be transmitted to the gate electrode of the first transistor T1 by the third transistor T3 which is simultaneously turned on. The second transistor T1 may be referred to as a switching transistor.

A gate electrode of the third transistor T3 may be connected to the scan line GWL. A first electrode of the third transistor T3 may be connected to the drain electrode of the first transistor T1 and a second electrode of the third transistor T3 may be connected to the first node N1. The third transistor T3 may be turned on according to the scan signal GW received through the scan line GWL, may connect the gate electrode of the first transistor T1 to the drain electrode of the first transistor T1 to diode connect the first transistor T1, and may compensate for a threshold voltage (Vth) of the first transistor T1. The third transistor T3 may be referred to as a compensation transistor.

A gate electrode of the fourth transistor T4 may be connected to the initialization control line GIL. A first electrode of the fourth transistor T4 may be connected to a first voltage line VL1 configured to transmit an initialization voltage Vint and a second electrode of the fourth transistor T4 may be connected to the first node N1. The fourth transistor T4 may be turned on according to the initialization control signal GI applied from the initialization control line GIL and may transmit the initialization voltage Vint to the gate electrode of the first transistor T1 to initialize a potential of the gate electrode of the first transistor T1 (e.g., a potential of the first node N1) to be a certain voltage. For example, the initialization voltage Vint may initialize the potential of the gate electrode of the first transistor T1. The initialization voltage Vint may be set to be a voltage that is higher than a common voltage ELVSS or may be set to be the common voltage ELVSS. The fourth transistor T4 may be referred to as an initialization transistor.

A gate electrode of the fifth transistor T5 may be connected to the emission control line EML. A first electrode of the fifth transistor T5 may be connected to the driving voltage line PL and a second electrode of the fifth transistor T5 may be connected to the source electrode of the first transistor T1. The fifth transistor T5 may be referred to as an operation control transistor.

A gate electrode of the sixth transistor T6 may be connected to the emission control line EML. A first electrode of the sixth transistor T6 may be connected to the drain electrode of the first transistor T1 and a second electrode of the sixth transistor T6 may be electrically connected to the pixel electrode (e.g., the anode) of the light-emitting diode LED. The fifth transistor T5 and the sixth transistor T6 may be simultaneously turned on according to the emission control signal EM applied from the emission control line EML. The driving voltage ELVDD applied through the turned-on fifth transistor T5 may be compensated for through the first transistor T1 and may be transmitted to the light-emitting diode LED. The sixth transistor T6 may be referred to as an emission control transistor.

A gate electrode of the seventh transistor T7 may be connected to the light-emitting diode initialization control line GBL. A first electrode of the seventh transistor T7 may be connected to the pixel electrode (e.g., the anode) of the light-emitting diode LED and a second electrode of the seventh transistor T7 may be connected to a second voltage line VL2 configured to transmit a light-emitting diode initialization voltage Vaint. The seventh transistor T7 may be turned on according to the light-emitting diode initialization control signal GB applied from the light-emitting diode initialization control line GBL and may transmit the light-emitting diode initialization voltage Vaint to the pixel electrode (e.g., the anode) of the light-emitting diode LED to initialize the potential of the pixel electrode (e.g., the anode) of the light-emitting diode LED to be a certain voltage. For example, the light-emitting diode initialization voltage Vaint may initialize the potential of an electrode of the light-emitting diode LED. The light-emitting diode initialization control signal GB may be the same signal as the initialization control signal GI or a different signal from the initialization control signal GI. The seventh transistor T7 may be referred to as a light-emitting diode initialization transistor.

An end of the storage capacitor Cst may be connected to the gate electrode of the first transistor T1 and the other end of the storage capacitor Cst may be connected to the driving voltage line PL. The storage capacitor Cst may be connected between the driving voltage line PL and the first node N1. The storage capacitor Cst may store a voltage corresponding to the difference between the driving voltage ELVDD and a voltage of the first node N1.

The pixel electrode (e.g., the anode) of the light-emitting diode LED may be connected to the repair line and may be separated from the pixel circuit PC. The opposite electrode (e.g., the cathode) of the light-emitting diode LED may be connected to a common voltage line configured to apply the common voltage ELVSS. The light-emitting diode LED may receive the driving current from the first transistor T1 and may emit light to display an image. The driving voltage ELVDD may be a certain high-level voltage, and the common voltage ELVSS may be lower than the driving voltage ELVDD or may be a ground voltage.

Figure 3A:
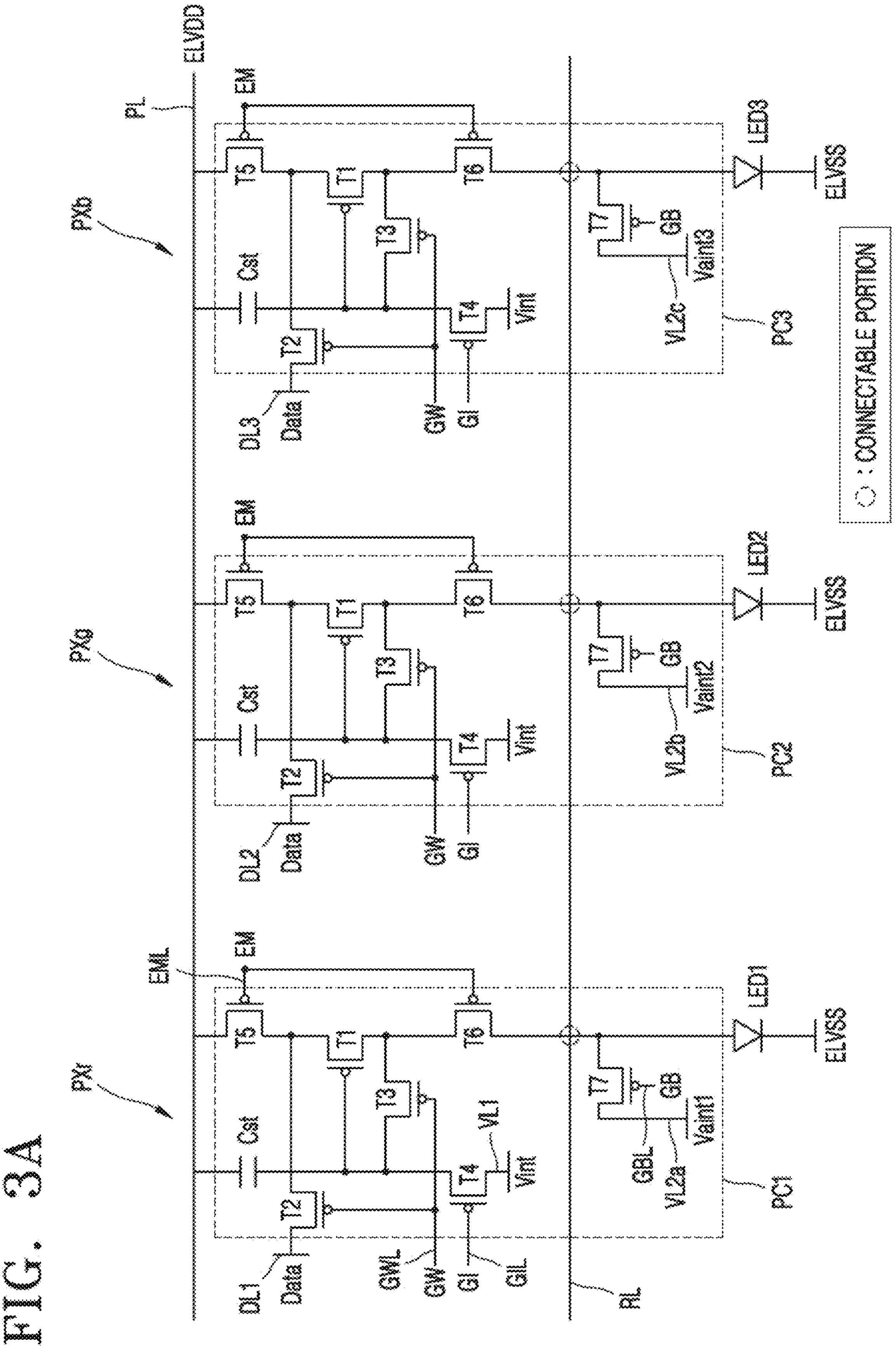
FIG. 3A is an equivalent circuit diagram of a pixel circuit of some pixels, according to some embodiments of the present disclosure.

FIG. 3A is an equivalent circuit diagram of a pixel circuit of some pixels, according to some embodiments of the present disclosure. The plurality of pixels PX (see, e.g., FIG. 1) may include a first pixel PXr, a second pixel PXg, and a third pixel PXb, each emitting different color light. FIG. 3A is an equivalent circuit diagram of a pixel circuit of each of the first pixel PXr, the second pixel PXg, and the third pixel PXb, each of which emits different color light. In describing FIG. 3A, aspects that are the same as described with reference to FIG. 2 are omitted. In a plan view of the display apparatus 1, the first pixel PXr, the second pixel PXg, and the third pixel PXb may be arranged in the same row.

Referring to FIG. 3A, the first pixel PXr may be electrically connected to a first data line DL1. The second pixel PXg may be electrically connected to a second data line DL2. The third pixel PXb may be electrically connected to a third data line DL3. The first pixel PXr, the second pixel PXg, and the third pixel PXb arranged in the same row may share the scan line GWL, the initialization control line GIL, the light-emitting diode initialization control line GBL, and the emission control line EML.

The first pixel PXr may include a first pixel circuit PC1 and a first light-emitting diode LED1. A seventh transistor of the first pixel circuit PC1 may be connected between a second-1 voltage line VL2a and a pixel electrode (e.g., an anode) of the first light-emitting diode LED1 and may receive a light-emitting diode initialization control signal GB. The first pixel PXr may emit first color light. For example, the first color light may be red light.

The second pixel PXg may include a second pixel circuit PC2 and a second light-emitting diode LED2. A seventh transistor of the second pixel circuit PC2 may be connected between a second-2 voltage line VL2b and a pixel electrode (e.g., an anode) of the second light-emitting diode LED2 and may receive a light-emitting diode initialization control signal GB. The second pixel PXg may emit second color light which is different from the first color light. For example, the second color light may be green light.

The third pixel PXb may include a third pixel circuit PC3 and a third light-emitting diode LED3. A seventh transistor of the third pixel circuit PC3 may be connected between a second-3 voltage line VL2c and a pixel electrode (e.g., an anode) of the third light-emitting diode LED3 and may receive a light-emitting diode initialization control signal GB. The third pixel PXb may emit third color light which is different from the first color light and the second color right. For example, the third color light may be blue light.

A first light-emitting diode initialization voltage Vaint1 may be applied to the second-1 voltage line VL2a. A second light-emitting diode initialization voltage Vaint2 may be applied to the second-2 voltage line VL2b. A third light-emitting diode initialization voltage Vaint3 may be applied to the second-3 voltage line VL2c. The first light-emitting diode initialization voltage Vaint1, the second light-emitting diode initialization voltage Vaint2, and the third light-emitting diode initialization voltage Vaint3 may each have a voltage of a different level. For example, the first to third light-emitting diode initialization voltages Vaint1, Vaint2, and Vaint3 may be differently provided according to a pixel type.

For example, FIG. 3A illustrates that the first light-emitting diode initialization voltage Vaint1 may be provided to the first pixel circuit PC1, the second light-emitting diode initialization voltage Vaint2 may be provided to the second pixel circuit PC2, the third light-emitting diode initialization voltage Vaint3 may be provided to the third pixel circuit PC3, and thus, the different light-emitting diode initialization voltage is provided to each of the first to third pixel circuits PC1 to PC3. However, the disclosure is not limited thereto. For example, the second-1 voltage line VL2a may be connected to the first pixel circuit PC1, and the second-2 voltage line VL2b may be connected to each of the second pixel circuit PC2 and the third pixel circuit PC3. For example, the first light-emitting diode initialization voltage Vaint1 may be provided to the first pixel circuit PC1, and the second light-emitting diode initialization voltage Vaint2 may be provided to the second pixel circuit PC2 and the third pixel circuit PC3.

The first pixel PXr, the second pixel PXg, and the third pixel PXb arranged in the same row may be electrically connected, through a repair line RL, to the repair circuit RC (see, e.g., FIG. 3B) arranged in a row corresponding to the first to third pixels PXr, PXg, and PXb. The first pixel PXr, the second pixel PXg, and the third pixel PXb arranged in the same row may be connected to one repair line RL, and the repair line RL may be arranged to be connected to the repair circuit described below. A detailed description about a repair process will be given below with reference to FIGS. 4A and 4B.

In this specification, the expression "may be connected to each other (e.g., may be electrically or physically connected to each other)" or "arranged to be connected to each other" may denote a state in which elements may be connected to each other (electrically or physically connected to each other) by using a laser beam, etc. in a repair process. For example, that a first member and a second member may be arranged to be connected to each other (electrically or physically connected to each other) may denote that although the first member and the second member are not actually connected to each other, the first member and the second member may be connected to each other (electrically or physically connected to each other) after a repair process. In a structural perspective, the first member and the second member "which may be connected to each other (e.g., physically connected to each other)" may be arranged to cross each other in an area in which the first and second members overlap with each other, with an insulating layer therebetween. When a laser beam is irradiated onto the overlapping area in a repair process, the insulating layer in the overlapping area may be broken down, and thus, the first member and the second member may be electrically connected to each other.

Also, in this specification, the expression "may be separated" or "detachably" may denote that an element may be separated by using a laser beam, etc. in the repair process. For example, that the first member and the second member may be detachably connected to each other may denote that although the first member and the second member may be actually connected to each other, the first member and the second member may be separated from each other in the repair process. In a structural perspective, the first member and the second member which may be detachably connected to each other may be arranged to be connected to each other through a conductive connection member. When a laser beam is irradiated onto the conductive connection member in the repair process, the conductive connection member may be broken down with a portion thereof, onto which the laser beam is irradiated, being melted, and thus, the first member and the second member may be electrically insulated from each other. For example, the conductive connection member may include a silicon layer which may be fused by a laser beam. As another example, the conductive connection member may be fused by Joule's heat based on currents and may be broken down.

Figure 3B:
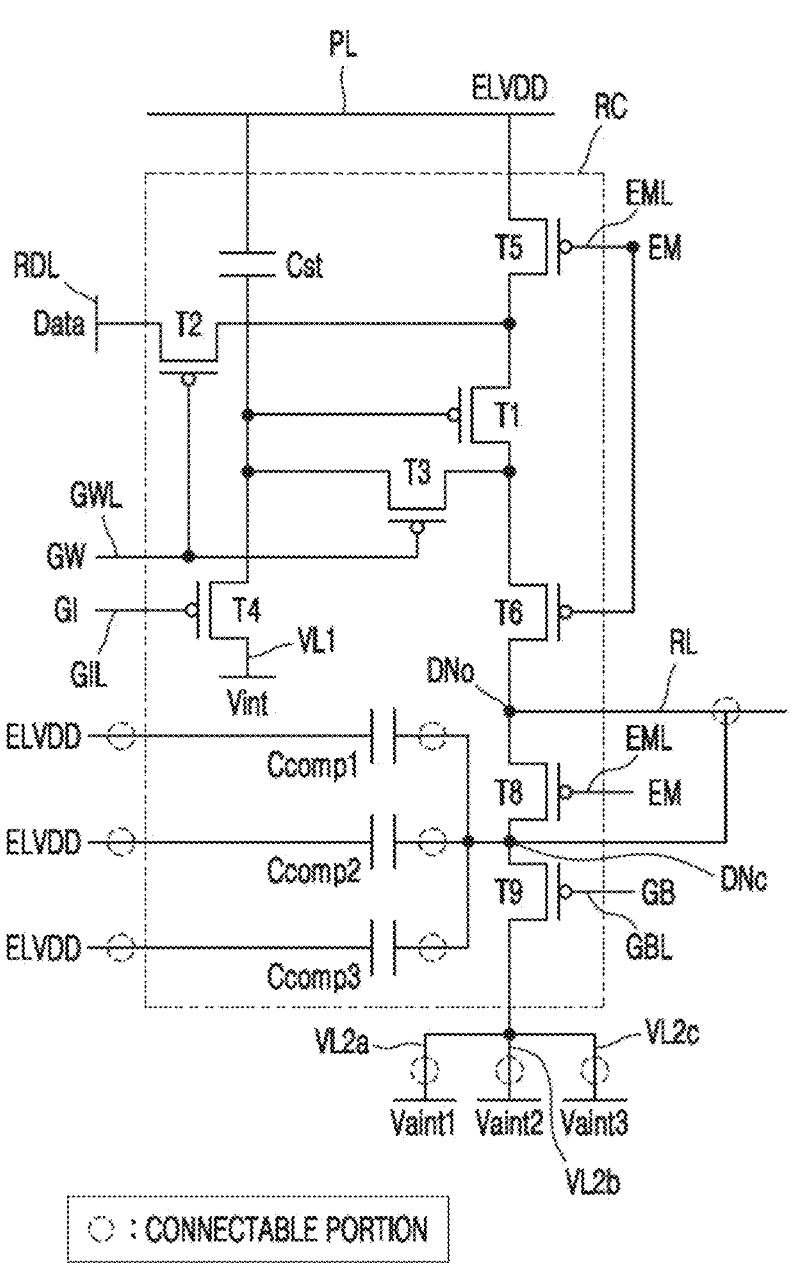
FIG. 3B is an equivalent circuit diagram of a repair circuit according to some embodiments of the present disclosure.

FIG. 3B is an equivalent circuit diagram of the repair circuit RC according to some embodiments. The repair circuit RC of FIG. 3B indicates one repair circuit RC arranged in a row corresponding to the first pixel PXr, the second pixel PXg, and the third pixel PXb arranged in the same row. The repair circuit RC of FIG. 3B may be electrically connected to each of the first pixel PXr, the second pixel PXg, and the third pixel PXb of FIG. 3A through the repair line RL.

Referring to FIG. 3B, the repair circuit RC may be connected to each of a scan line GWL, an initialization control line GIL, a light-emitting diode initialization control line GBL, and an emission control line EML and may receive a scan signal GW, an initialization control signal GI, a light-emitting diode initialization control signal GB, and an emission control signal EM. For example, the scan line GWL, the initialization control line GIL, the light-emitting diode initialization control line GBL, and the emission control line EML of FIG. 3B may be the signal lines corresponding to the signal lines connected to each of the first pixel PXr, the second pixel PXg, and the third pixel PXb of FIG. 3A.

The repair circuit RC may receive a data signal Data through a repair data line RDL. For example, the repair data line RDL may be electrically connected to a data line connected to a defective pixel. For example, the data line DL (see, e.g., FIG. 2) connected to each of the plurality of pixels PX (see, e.g., FIG. 2) may be arranged to overlap with a connection line, and by irradiating a laser beam onto an area in which the data line DL (see, e.g., FIG. 2) connected to a defective pixel overlaps with the connection line, the data line DL (see, e.g., FIG. 2) connected to the defective pixel and the connection line may be electrically connected to each other. Thus, the data line DL (see, e.g., FIG. 2) connected to the defective pixel may be electrically connected to the repair data line RDL.

The repair circuit RC may include a plurality of transistors T1, T2, T3, T4, T5, T6, T8, and T9, a storage capacitance element, and a compensation capacitance element. The plurality of transistors T1 to T6, T8, and T9 of the repair circuit RC may include a first transistor T1, a second transistor T2, a third transistor T3, a fourth transistor T4, a fifth transistor T5, a sixth transistor T6, an eighth transistor T8, and a ninth transistor T9. The storage capacitance element and the compensation capacitance element may be capacitors, and in this specification, the storage capacitance element may be represented as the storage capacitor Cst, and the compensation capacitance element may be represented as a first compensation capacitor Ccomp1, a second compensation capacitor Ccomp2, and a third compensation capacitor Ccomp3. The elements of the repair circuit RC may have different sizes and capacitances from the elements of the pixel circuit PC (see, e.g., FIG. 2).

The repair circuit RC may be substantially the same as the pixel circuit PC of the pixel PX illustrated in FIG. 2, except for some differences. Hereinafter, the same aspects are not repeatedly described and different aspects are mainly described.

A gate electrode of the eighth transistor T8 may be connected to the emission control line EML and may receive the emission control signal EM. A first electrode of the eighth transistor T8 may be connected to the repair line RL through an output node DNo and a second electrode of the eighth transistor T8 may be connected to a compensation node DNc. According to some embodiments, the eighth transistor T8 may be turned on according to the emission control signal EM and may supply energy stored in one of the first to third compensation capacitors Ccomp1 to Ccomp3 to the repair line RL. The eighth transistor T8 may be referred to as capacitance control transistor.

The repair line RL may be electrically connected to the second electrode of the eighth transistor T8 and a first electrode of the ninth transistor T9. For example, the repair line RL may be arranged to overlap with a connection member connected to the second electrode of the eighth transistor T8, and by irradiating a laser beam onto an overlapping area of the repair line RL and the connection member, the repair line RL may be electrically connected to the second electrode of the eighth transistor T8.

According to some embodiments, in the event of a defective pixel (e.g., any one of the first to third pixels PXr, PXg, and PXb of FIG. 3A), a first electrode of a compensation capacitor corresponding to the defective pixel type from among the first to third compensation capacitors Ccomp1 to Ccomp3 may be electrically connected to the eighth transistor T8 and the ninth transistor T9 via laser beam irradiation, and a second electrode of the compensation capacitor may be electrically connected, via laser beam irradiation, to a driving voltage line PL through which a driving voltage ELVDD is transmitted. For example, in a case where the first pixel PXr (see, e.g., FIG. 3A) is defective, the first electrode of the first compensation capacitor Ccomp1 may be electrically connected to the eighth transistor T8 and the ninth transistor T9, and the second electrode of the first compensation capacitor Ccomp1 may be electrically connected to the driving voltage line PL through which the driving voltage ELVDD is transmitted.

A gate electrode of the ninth transistor T9 may be connected to the light-emitting diode initialization control line GBL and may receive the light-emitting diode initialization control signal GB. The first electrode of the ninth transistor T9 may be connected to the compensation node DNc. According to some embodiments, a second electrode of the ninth transistor T9 may be connected to one of a second-1 voltage line VL2a, a second-2 voltage line VL2b, and a second-3 voltage line VL2c. For example, a voltage line (e.g., one of the second-1 voltage line VL2a, the second-2 voltage line VL2b, and the second-3 voltage line VL2c of FIG. 3A) electrically connected to the defective pixel (e.g., any one of the first pixel PXr, the second pixel PXg, and the third pixel PXb of FIG. 3A) may be electrically connected to the repair circuit RC via laser beam irradiation.

The ninth transistor T9 may be turned on according to the light-emitting diode initialization control signal GB and may supply, to the compensation capacitor (e.g., the compensation capacitor connected to the ninth transistor T9 from among the first to third compensation capacitors Ccomp1 to Ccomp3), a light-emitting diode initialization voltage, so that the compensation capacitor may be charged with an amount of charge corresponding to the difference between the driving voltage ELVDD and the light-emitting diode initialization voltage (e.g., one of a first light-emitting diode initialization voltage Vaint1, a second light-emitting diode initialization voltage Vaint2, and a third light-emitting diode initialization voltage Vaint3). The ninth transistor T9 may be referred to as a capacitance element initialization transistor. The driving voltage ELVDD and a voltage of the compensation node DNc may be applied to both ends of the compensation capacitor, and a charge corresponding to the difference of voltages of both ends of the compensation capacitor may be stored in the compensation capacitor.

For example, FIG. 3B illustrates that the repair circuit RC may be connected to one of the second-1 voltage line VL2a, the second-2 voltage line VL2b, and the second-3 voltage line VL2c configured to transmit the first light-emitting diode initialization voltage Vaint1, the second light-emitting diode initialization voltage Vaint2, and the third light-emitting diode initialization voltage Vaint3, respectively. However, the disclosure is not limited thereto. According to some other embodiments, when the first light-emitting diode initialization voltage Vaint1 is transmitted to the first pixel circuit PC1 of the first pixel PXr, the second light-emitting diode initialization voltage Vaint2 is transmitted to each of the second pixel circuit PC2 of the second pixel PXg, and the third pixel circuit PC3 of the third pixel PXb, the repair circuit RC may be connected to one of the second-1 voltage line VL2a and the second-2 voltage line VL2b configured to transmit the first light-emitting diode initialization voltage Vaint1 and the second light-emitting diode initialization voltage Vaint2, respectively.

For example, FIG. 3B illustrates that the repair circuit RC may be connected to one of the first to third compensation capacitors Ccomp1 to Ccomp3. According to some other embodiments, when the first light-emitting diode initialization voltage Vaint1 is transmitted to the first pixel circuit PC1 of the first pixel PXr and the second light-emitting diode initialization voltage Vaint2 is transmitted to each of the second pixel circuit PC2 of the second pixel PXg and the third pixel circuit PC3 of the third pixel PXb, the repair circuit RC may be connected to one of the first compensation capacitor Ccomp1 and the second compensation capacitor Ccomp2.

Figure 4B:
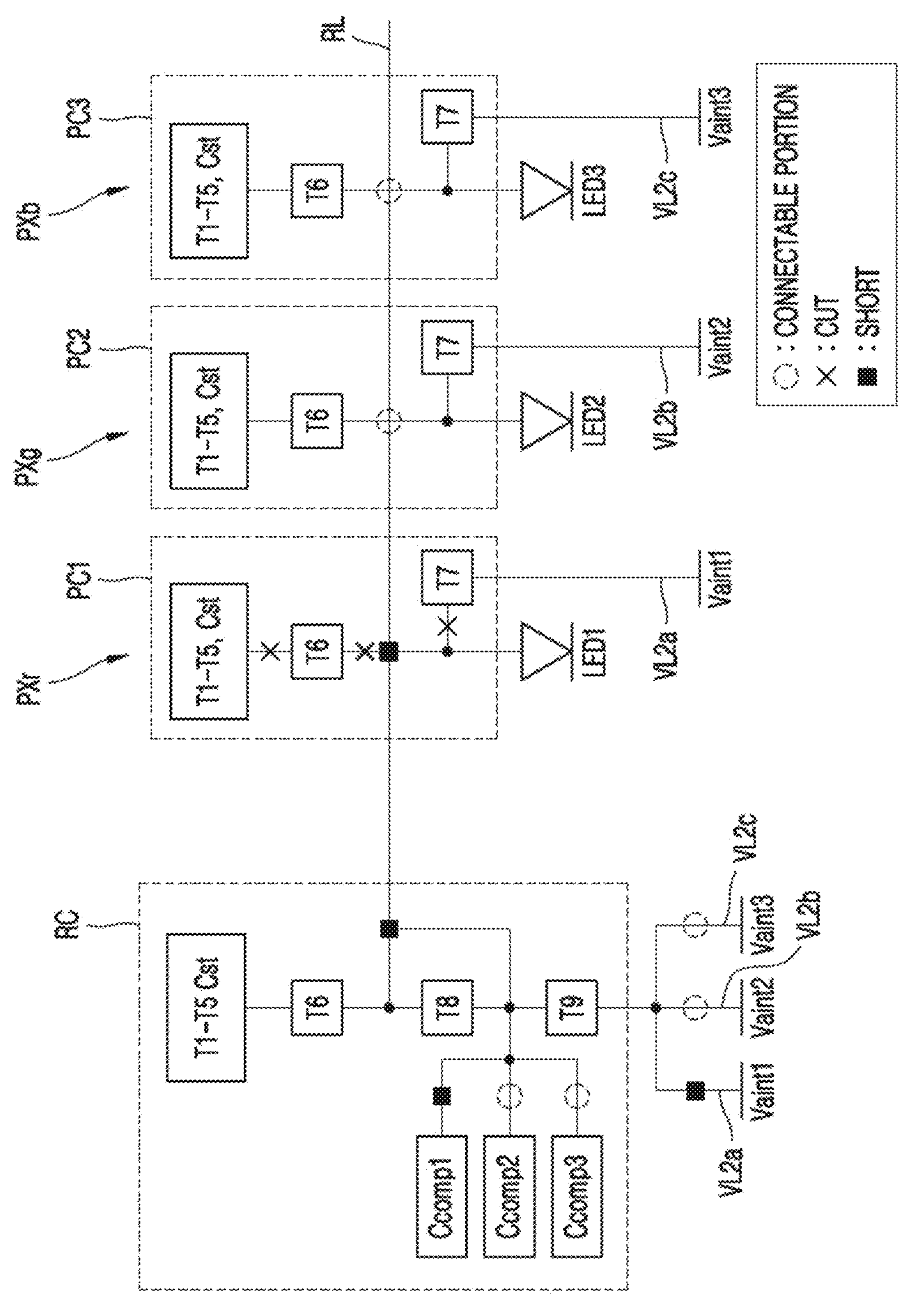
Figure 4C:
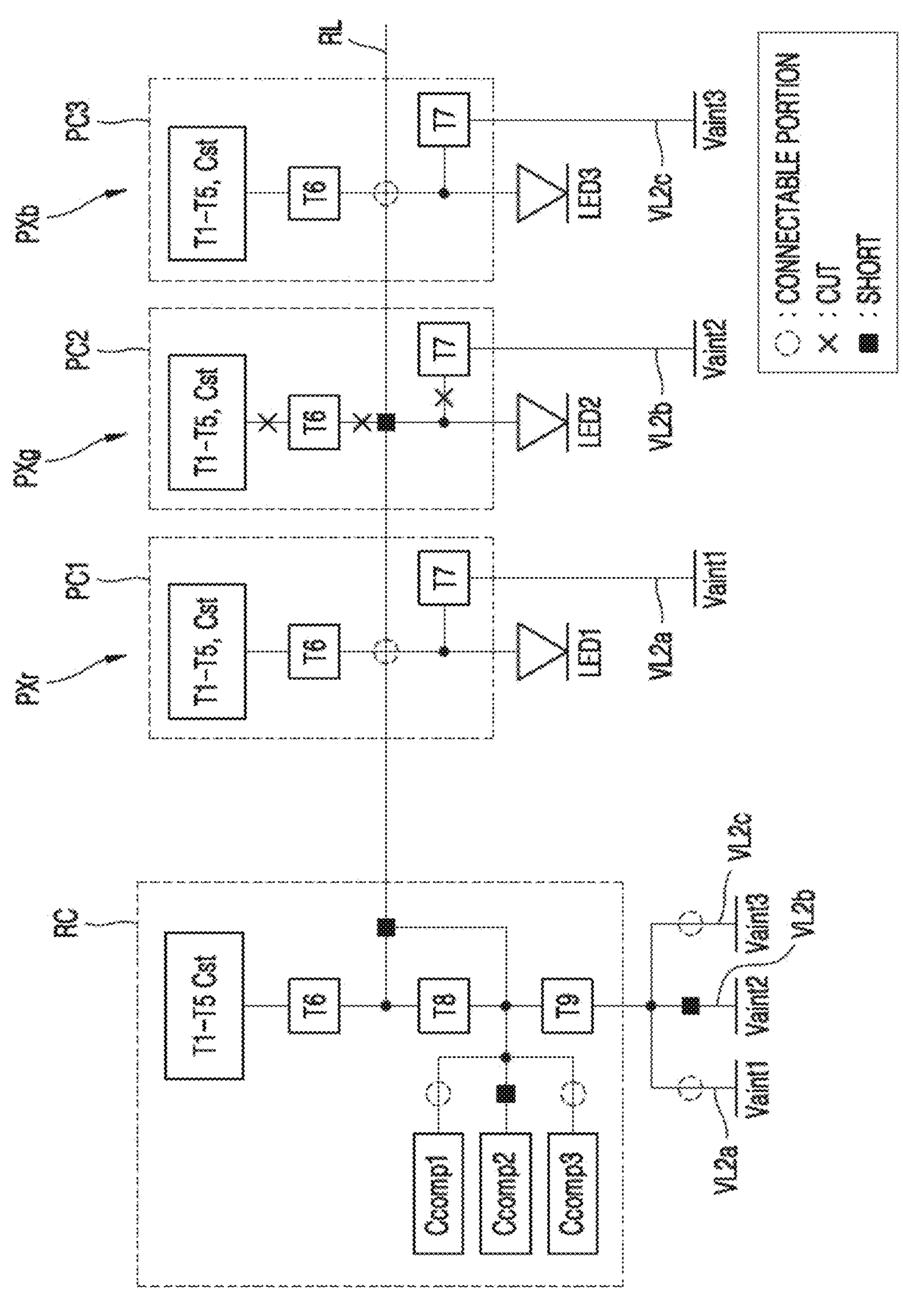
Figure 4D:
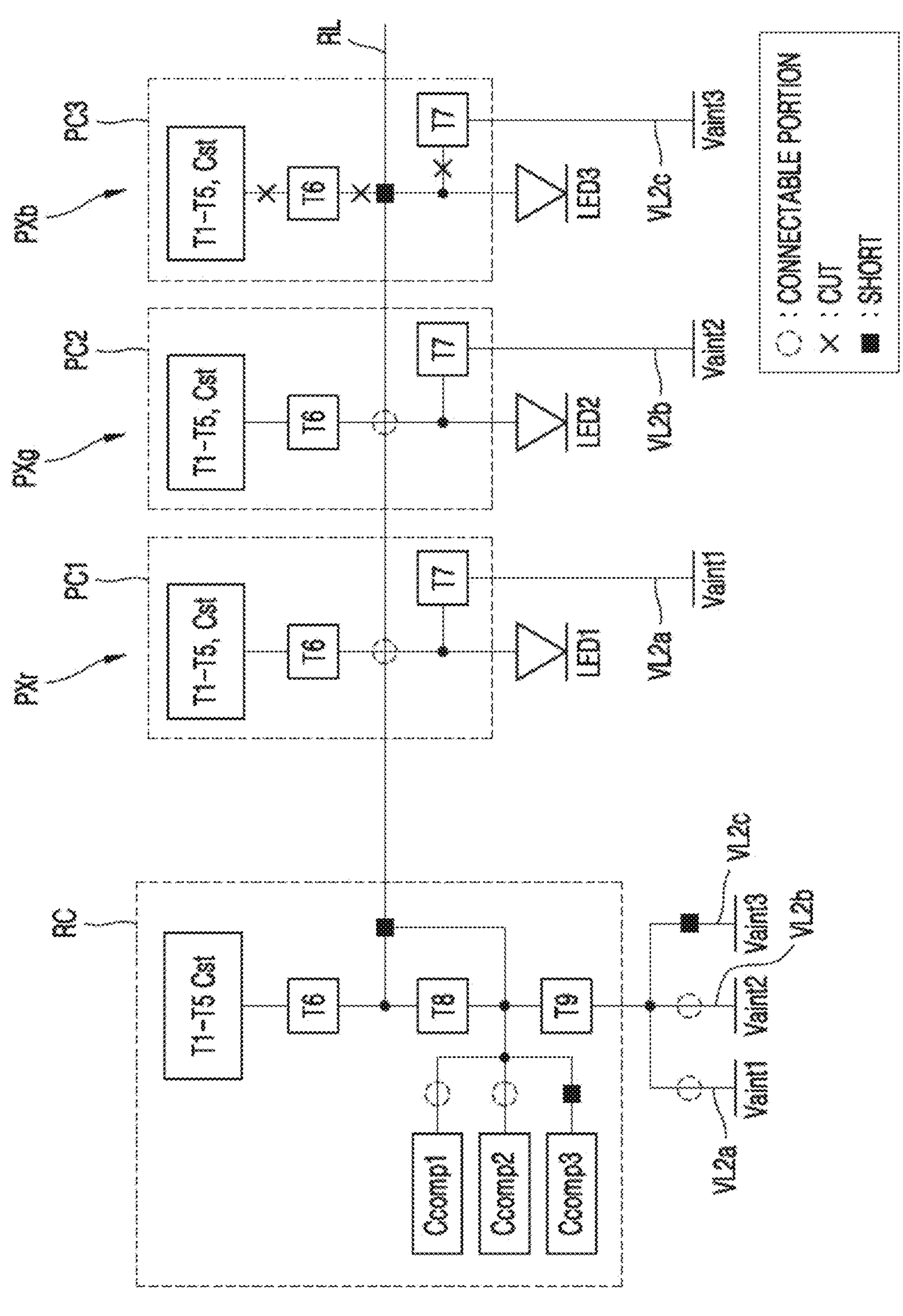

FIGS. 4A to 4D are views to describe a method of repairing a pixel in which a defect has occurred according to some embodiments of the present disclosure. Each of FIGS. 4A to 4D is a schematic diagram showing a connection relationship of the repair circuit RC and the first to third pixel circuits PC1 to PC3 arranged in the same row. FIG. 4A schematically illustrates the connection relationship when the first to third pixel circuits PC1 to PC3 are normally driven. FIGS. 4B, 4C, and 4D schematically illustrate the method of repairing a defective pixel, when the first pixel PXr is defective, when the second pixel PXg is defective, and when the third pixel PXb is defective, respectively.

Referring to FIG. 4A, the repair line RL may be arranged to be electrically connected to the first light-emitting diode LED1 of the first pixel circuit PC1, the second light-emitting diode LED2 of the second pixel circuit PC2, and the third light-emitting diode LED3 of the third pixel circuit PC3. The repair line RL may be electrically connected to the repair circuit RC. For example, the repair line RL may be electrically connected to the eighth transistor T8.

Each of the first compensation capacitor Ccomp1, the second compensation capacitor Ccomp2, and the third compensation capacitor Ccomp3 may be electrically connected to the eighth transistor T8 and the ninth transistor T9.

Each of the second-1 voltage line VL2a configured to transmit the first light-emitting diode initialization voltage Vaint1, the second-2 voltage line VL2b configured to transmit the second light-emitting diode initialization voltage Vaint2, and the second-3 voltage line VL2c configured to transmit the third light-emitting diode initialization voltage Vaint3 may be electrically connected to the ninth transistor T9.

Referring to FIG. 4B, when the first pixel PXr is defective, the first light-emitting diode LED1 of the first pixel PXr may be separated from the first pixel circuit PC1. For example, a laser beam may be irradiated onto a connection area of the first light-emitting diode LED1 and the first pixel circuit PC1 to cut the connection area, so that the first light-emitting diode LED1 of the first pixel PXr may be separated from the first pixel circuit PC1. For example, a laser beam may be irradiated onto a connection area of the first light-emitting diode LED1 and the sixth transistor T6 of the first pixel circuit PC1 to cut the connection area, a laser beam may be irradiated onto a connection area of the first light-emitting diode LED1 and the seventh transistor T7 of the first pixel circuit PC1 to cut the connection area, and a laser beam may be irradiated onto a connection area of the sixth transistor T6 and the first transistor T1 of the first pixel circuit PC1 to cut the connection area, so that the first light-emitting diode LED1 may be separated from the first pixel circuit PC1.

When the first pixel PXr is defective, the first light-emitting diode LED1 of the first pixel PXr and the repair circuit RC may be electrically connected to each other. To this end, the first light-emitting diode LED1 of the first pixel PXr, which is the defective pixel, may be electrically connected to the repair line RL in the same row. For example, by irradiating a laser beam onto an overlapping area of a connection member connected to the first light-emitting diode LED1 of the first pixel PXr and the repair line RL in the same row, the first light-emitting diode LED1 may be electrically connected to the repair line RL. Because the repair line RL may be connected to the repair circuit RC, the first light-emitting diode LED1 of the first pixel PXr, which is the defective pixel, may be connected to the repair circuit RC.

According to some embodiments, the second-1 voltage line VL2a connected to the first pixel circuit PC1 of the first pixel PXr, which is the defective pixel, may be electrically connected to the repair circuit RC. For example, when the first pixel PXr is defective, the first light-emitting diode initialization voltage Vaint1 may be transmitted to the repair circuit RC. For example, the seventh transistor T7 of the first pixel circuit PC1 may be separated from the first light-emitting diode LED1, and the second-1 voltage line VL2a connected to the seventh transistor T7 of the first pixel circuit PC1 may be electrically connected to the ninth transistor T9 of the repair circuit RC. For example, the second-1 voltage line VL2a may overlap with a connection member connected to the ninth transistor T9 of the repair circuit RC, and by irradiating a laser beam onto the overlapping area of the second-1 voltage line VL2a and the connection member, the second-1 voltage line VL2a and the connection member may be connected to each other. Thus, the ninth transistor T9 of the repair circuit RC may be electrically connected to the second-1 voltage line VL2a.

According to some embodiments, when the first pixel PXr is defective, the first compensation capacitor Ccomp1 may be electrically connected to the repair circuit RC. For example, the first compensation capacitor Ccomp1 may be electrically connected to the eighth transistor T8 and the ninth transistor T9 of the repair circuit RC. For example, a capacitor connection member connected to the first compensation capacitor Ccomp1 and a transistor connection member connected to the eighth transistor T8 may overlap with each other, and by irradiating a laser beam onto the overlapping area of the capacitor connection member and the transistor connection member, the eighth transistor T8 and the first compensation capacitor Ccomp1 may be electrically connected to each other. For example, the capacitor connection member connected to the first compensation capacitor Ccomp1 and a transistor connection member connected to the ninth transistor T9 may overlap with each other, and by irradiating a laser beam onto the overlapping area of the capacitor connection member and the transistor connection member, the ninth transistor T9 and the first compensation capacitor Ccomp1 may be electrically connected to each other.

Referring to FIG. 4C, when the second pixel PXg is defective, the second light-emitting diode LED2 of the second pixel PXg may be separated from the second pixel circuit PC2. For example, a laser beam may be irradiated onto a connection area of the second light-emitting diode LED2 and the second pixel circuit PC2 to cut the connection area, so that the second light-emitting diode LED2 of the second pixel PXg may be separated from the second pixel circuit PC2. For example, a laser beam may be irradiated onto a connection area of the second light-emitting diode LED2 and the sixth transistor T6 of the second pixel circuit PC2 to cut the connection area, a laser beam may be irradiated onto a connection area of the second light-emitting diode LED2 and the seventh transistor T7 of the second pixel circuit PC2 to cut the connection area, and a laser beam may be irradiated onto a connection area of the sixth transistor T6 and the first transistor T1 of the second pixel circuit PC2 to cut the connection area, so that the second light-emitting diode LED2 may be separated from the second pixel circuit PC2.

When the second pixel PXg is defective, the second light-emitting diode LED2 of the second pixel PXg and the repair circuit RC may be electrically connected to each other. To this end, the second light-emitting diode LED2 of the second pixel PXg, which is the defective pixel, may be electrically connected to the repair line RL in the same row. For example, by irradiating a laser beam onto an overlapping area of a connection member connected to the second light-emitting diode LED2 of the second pixel PXg and the repair line RL in the same row, the second light-emitting diode LED2 may be electrically connected to the repair line RL. Because the repair line RL may be connected to the repair circuit RC, the second light-emitting diode LED2 of the second pixel PXg, which is the defective pixel, may be connected to the repair circuit RC.

According to some embodiments, the second-2 voltage line VL2b connected to the second pixel circuit PC2 of the second pixel PXg, which is the defective pixel, may be electrically connected to the repair circuit RC. For example, when the second pixel PXg is defective, the second light-emitting diode initialization voltage Vaint2 may be transmitted to the repair circuit RC. For example, the seventh transistor T7 of the second pixel circuit PC2 may be separated from the second light-emitting diode LED2, and the second-2 voltage line VL2b connected to the seventh transistor T7 of the second pixel circuit PC2 may be electrically connected to the ninth transistor T9 of the repair circuit RC. For example, the second-2 voltage line VL2b may overlap with a connection member connected to the ninth transistor T9 of the repair circuit RC, and by irradiating a laser beam onto the overlapping area of the second-2 voltage line VL2b and the connection member, the second-2 voltage line VL2b and the connection member may be connected to each other. Thus, the ninth transistor T9 of the repair circuit RC may be electrically connected to the second-2 voltage line VL2b.

According to some embodiments, when the second pixel PXg is defective, the second compensation capacitor Ccomp2 may be electrically connected to the repair circuit RC. For example, the second compensation capacitor Ccomp2 may be electrically connected to the eighth transistor T8 and the ninth transistor T9 of the repair circuit RC. For example, a capacitor connection member connected to the second compensation capacitor Ccomp2 and a transistor connection member connected to the eighth transistor T8 may overlap with each other, and by irradiating a laser beam onto the overlapping area of the capacitor connection member and the transistor connection member, the eighth transistor T8 and the second compensation capacitor Ccomp2 may be electrically connected to each other. For example, the capacitor connection member connected to the second compensation capacitor Ccomp2 and a transistor connection member connected to the ninth transistor T9 may overlap with each other, and by irradiating a laser beam onto the overlapping area of the capacitor connection member and the transistor connection member, the ninth transistor T9 and the second compensation capacitor Ccomp2 may be electrically connected to each other.

Referring to FIG. 4D, when the third pixel PXb is defective, the third light-emitting diode LED3 of the third pixel PXb may be separated from the third pixel circuit PC3. For example, by irradiating a laser beam onto a connection area of the third light-emitting diode LED3 and the third pixel circuit PC3 to cut the connection area, the third light-emitting diode LED3 of the third pixel PXb may be separated from the third pixel circuit PC3. For example, a laser beam may be irradiated onto a connection area of the third light-emitting diode LED3 and the sixth transistor T6 of the third pixel circuit PC3 to cut the connection area, a laser beam may be irradiated onto a connection area of the third light-emitting diode LED3 and the seventh transistor T7 of the third pixel circuit PC3 to cut the connection area, and a laser beam may be irradiated onto a connection area of the sixth transistor T6 and the first transistor T1 of the third pixel circuit PC3 to cut the connection area, so that the third light-emitting diode LED3 may be separated from the third pixel circuit PC3.

When the third pixel PXb is defective, the third light-emitting diode LED3 of the third pixel PXb and the repair circuit RC may be electrically connected to each other. To this end, the third light-emitting diode LED3 of the third pixel PXb, which is the defective pixel, may be electrically connected to the repair line RL in the same row. For example, by irradiating a laser beam onto an overlapping area of a connection member connected to the third light-emitting diode LED3 of the third pixel PXb and the repair line RL in the same row, the third light-emitting diode LED3 may be electrically connected to the repair line RL. Because the repair line RL may be connected to the repair circuit RC, the third light-emitting diode LED3 of the third pixel PXb, which is the defective pixel, may be connected to the repair circuit RC.

According to some embodiments, the second-3 voltage line VL2c connected to the third pixel circuit PC3 of the third pixel PXb, which is the defective pixel, may be electrically connected to the repair circuit RC. For example, when the third pixel PXb is defective, the third light-emitting diode initialization voltage Vaint3 may be transmitted to the repair circuit RC. For example, the seventh transistor T7 of the third pixel circuit PC3 may be separated from the third light-emitting diode LED3, and the second-3 voltage line VL2c connected to the seventh transistor T7 of the third pixel circuit PC3 may be electrically connected to the ninth transistor T9 of the repair circuit RC. For example, the second-3 voltage line VL2c may overlap with a connection member connected to the ninth transistor T9 of the repair circuit RC, and by irradiating a laser beam onto the overlapping area of the second-3 voltage line VL2c and the connection member, the second-3 voltage line VL2c and the connection member may be connected to each other. Thus, the ninth transistor T9 of the repair circuit RC may be electrically connected to the second-3 voltage line VL2c.

According to some embodiments, when the third pixel PXb is defective, the third compensation capacitor Ccomp3 may be electrically connected to the repair circuit RC. For example, the third compensation capacitor Ccomp3 may be electrically connected to the eighth transistor T8 and the ninth transistor T9 of the repair circuit RC. For example, a capacitor connection member connected to the third compensation capacitor Ccomp3 and a transistor connection member connected to the eighth transistor T8 may overlap with each other, and by irradiating a laser beam onto the overlapping area of the capacitor connection member and the transistor connection member, the eighth transistor T8 and the third compensation capacitor Ccomp3 may be electrically connected to each other. For example, the capacitor connection member connected to the third compensation capacitor Ccomp3 and a transistor connection member connected to the ninth transistor T9 may overlap with each other, and by irradiating a laser beam onto the overlapping area of the capacitor connection member and the transistor connection member, the ninth transistor T9 and the third compensation capacitor Ccomp3 may be electrically connected to each other.

According to a comparative embodiment, when any one of the first to third pixels PXr to PXb is defective, the same one initialization voltage (e.g., the first light-emitting diode initialization voltage Vaint1) may be transmitted to a repair circuit. However, according to some embodiments, as described with reference to FIGS. 4A to 4D, when one of the first pixel PXr, the second pixel PXg, and the third pixel PXb, each emitting different color light, is defective, a voltage line may be connected to transmit, to the repair circuit RC, one of the first light-emitting diode initialization voltage Vaint1, the second light-emitting diode initialization voltage Vaint2, and the third light-emitting diode initialization voltage Vaint3, the one corresponding to the pixel circuit of the defective pixel. According to some embodiments, the level of the light-emitting diode initialization voltage transmitted to the repair circuit RC may vary according to types of pixels emitting different color light, and thus, color deviation of a display apparatus after a repair process may be reduced, and thus, display quality may be improved.

According to a comparative embodiment, when any one of the first pixel PXr, the second pixel PXg, and the third pixel PXb is defective, the same one compensation capacitor may be connected to the repair circuit and may supply stored energy. However, according to some embodiments, as described with reference to FIGS. 4A to 4D, when one of the first pixel PXr, the second pixel PXg, and the third pixel PXb is defective, one of the first compensation capacitor Ccomp1, the second compensation capacitor Ccomp2, and the third compensation capacitor Ccomp3, which corresponds to the defective pixel, may be connected to the repair circuit RC. According to some embodiments, the different compensation capacitors may be connected to the repair circuit RC according to types of pixels each emitting different color light, and thus, color deviation in a display apparatus after a repair process may be reduced, and display quality may be improved.

Figure 5:
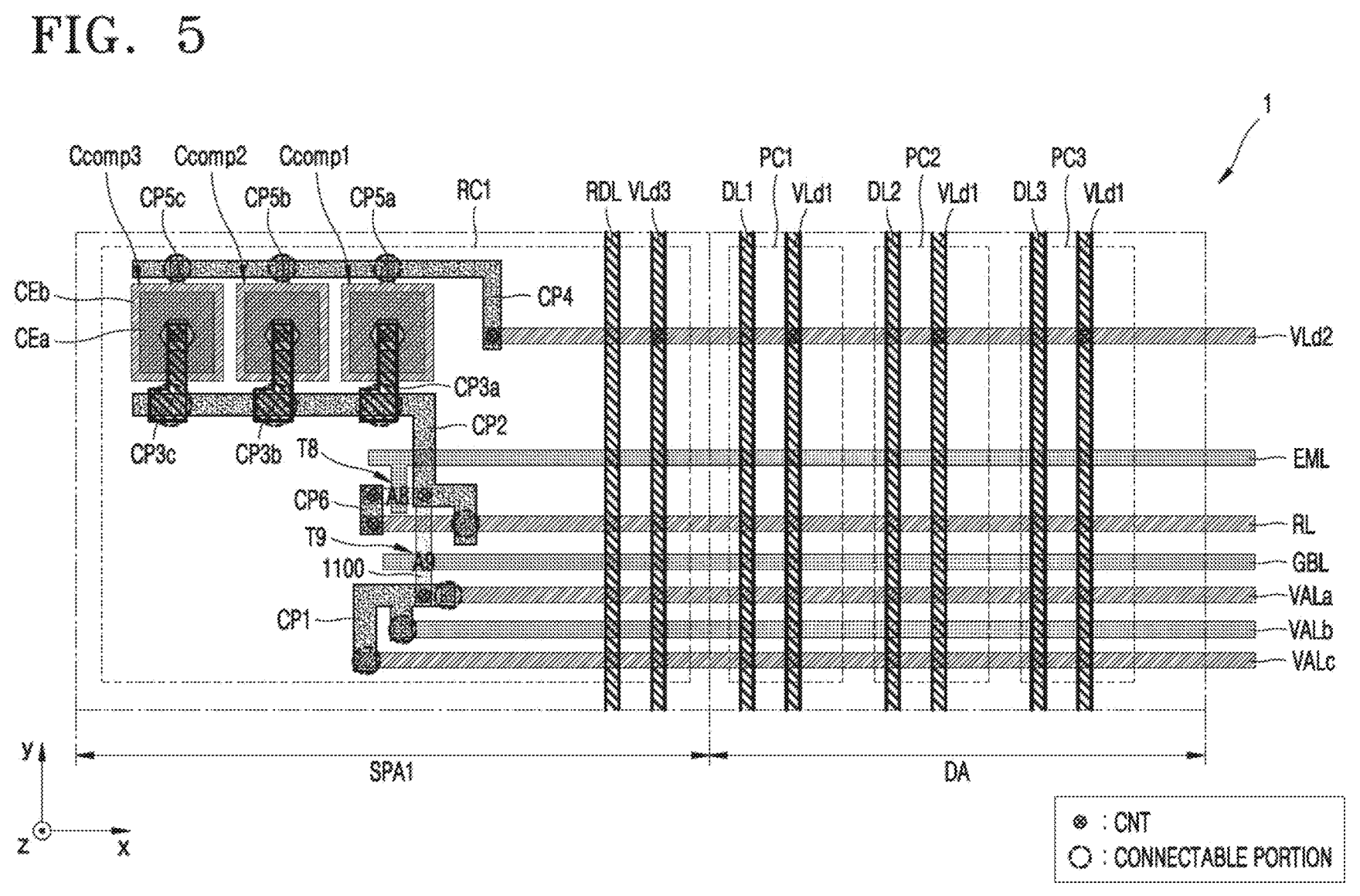

FIG. 5 is a schematic plan view of a portion of elements arranged in the first side peripheral area SPA1 and the display area DA of the display apparatus 1 according to some embodiments of the present disclosure. FIG. 5 illustrates the first repair circuit RC1 and the first to third pixel circuits PC1 to PC3, which are arranged in the same row.

Referring to FIG. 5, the first to third pixel circuits PC1 to PC3 may be arranged in the display area DA, and the first repair circuit RC1 may be arranged in the first side peripheral area SPA1. For convenience of explanation, FIG. 5 illustrates the eighth transistor T8 and the ninth transistor T9 of the first repair circuit RC1 and the first to third compensation capacitors Ccomp1 to Ccomp3, and the remaining transistors and the storage capacitor are omitted in FIG. 5.

In the display area DA, each of the first data line DL1 electrically connected to the first pixel circuit PC1, the second data line DL2 electrically connected to the second pixel circuit PC2, and the third data line DL3 electrically connected to the third pixel circuit PC3 may extend in a second direction (e.g., a y direction). In the first side peripheral area SPA1, the repair data line RDL electrically connected to the first repair circuit RC1 may extend in the second direction (e.g., the y direction).

In the display area DA, each of first driving voltage transmission lines VLd1 respectively and electrically connected to the first pixel circuit PC1, the second pixel circuit PC2, and the third pixel circuit PC3 may extend in the second direction (e.g., the y direction). In the first side peripheral area SPA1, a third driving voltage transmission line VLd3 electrically connected to the first repair circuit RC1 may extend in the second direction (e.g., the y direction). The first driving voltage transmission lines VLd1 may be electrically connected to a second driving voltage transmission line VLd2 crossing the first driving voltage transmission lines VLd1, through a contact portion CNT. The third driving voltage transmission lines VLd3 may be electrically connected to the second driving voltage transmission line VLd2 crossing the third driving voltage transmission line VLd3, through the contact portion CNT.

The first driving voltage transmission line VLd1 and the second driving voltage transmission line VLd2 may be arranged on different layers from each other. For example, the first driving voltage transmission line VLd1 may be arranged above the second driving voltage transmission line VLd2. For example, the first driving voltage transmission line VLd1 may be arranged on a first via insulating layer 110 (see, e.g., FIG. 8), and the second driving voltage transmission line VLd2 may be arranged on a second gate insulating layer 105 (see, e.g., FIG. 8). The third driving voltage transmission line VLd3 may be arranged at (e.g., on) the same layer as the first driving voltage transmission line VLd1 and may be arranged on a different layer from the second driving voltage transmission line VLd2. Each of the first driving voltage transmission line VLd1, the second driving voltage transmission line VLd2, and the third driving voltage transmission line VLd3 may correspond to the driving voltage line PL described with reference to FIG. 2. For example, the first driving voltage transmission line VLd1 and the second driving voltage transmission line VLd2 may transmit the driving voltage ELVDD.

In this specification, that "A" and "B" may be electrically connected to each other by the contact portion CNT may denote that "A" and "B" may be directly connected to each other by a contact hole or that "A" and "B may be electrically connected to each other by a connection member.

For example, the display apparatus 1 may include a first light-emitting diode initialization voltage line VALa, a second light-emitting diode initialization voltage line VALb, a third light-emitting diode initialization voltage line VALc, the second driving voltage transmission line VLd2, the emission control line EML, the repair line RL, and the light-emitting diode initialization control line GBL. Each of the first light-emitting diode initialization voltage line VALa, the second light-emitting diode initialization voltage line VALb, the third light-emitting diode initialization voltage line VALc, the second driving voltage transmission line VLd2, the emission control line EML, the repair line RL, and the light-emitting diode initialization control line GBL may extend in a first direction (e.g., an x direction), in the display area DA.

The first light-emitting diode initialization voltage line VALa, the second light-emitting diode initialization voltage line VALb, and the third light-emitting diode initialization voltage line VALc may respectively correspond to the second-1 voltage line VL2a, the second-2 voltage line VL2b, and the second-3 voltage line VL2c described with reference to FIG. 3A. The first light-emitting diode initialization voltage line VALa, the second light-emitting diode initialization voltage line VALb, and the third light-emitting diode initialization voltage line VALc may transmit the first light-emitting diode initialization voltage Vaint1 (see, e.g., FIG. 3A), the second light-emitting diode initialization voltage Vaint2 (see, e.g., FIG. 3A), and the third light-emitting diode initialization voltage Vaint3 (see, e.g., FIG. 3A), respectively.

The display apparatus 1 may include a first connection pattern CP1 arranged in the first side peripheral area SPA1. The first connection pattern CP1 may be connected to a semiconductor pattern 1100 by the contact portion CNT. The first connection pattern CP1 may be electrically connected to a semiconductor layer A8 of the eighth transistor T8 and a semiconductor layer A9 of the ninth transistor T9. For example, the first connection pattern CP1 may be connected to the semiconductor layer A9 of the ninth transistor T9 (e.g., a second impurity area of the semiconductor layer A9 of the ninth transistor T9) by the contact portion CNT.

The first light-emitting diode initialization voltage line VALa, the second light-emitting diode initialization voltage line VALb, and the third light-emitting diode initialization voltage line VALc may be arranged to be apart from each other in the second direction (e.g., the y direction) in a plan view. Each of the first light-emitting diode initialization voltage line VALa, the second light-emitting diode initialization voltage line VALb, and the third light-emitting diode initialization voltage line VALc may extend to the first side peripheral area SPA1 from the display area DA and may be electrically connected to the eighth transistor T8 and the ninth transistor T9 of the first repair circuit RC1. Each of the first light-emitting diode initialization voltage line VALa, the second light-emitting diode initialization voltage line VALb, and the third light-emitting diode initialization voltage line VALc may be arranged to overlap with the first connection pattern CP1 to be electrically connected to the first connection pattern CP1.

For example, the first connection pattern CP1 may be electrically connected to the eighth transistor T8 and the ninth transistor T9, and thus, by irradiating a laser beam onto an area in which the first light-emitting diode initialization voltage line VALa and the first connection pattern CP1 overlap with each other, the first light-emitting diode initialization voltage line VALa may be electrically connected to the eighth transistor T8 and the ninth transistor T9 by the first connection pattern CP1. Similarly, by irradiating a laser beam onto an area in which the second light-emitting diode initialization voltage line VALb and the first connection pattern CP1 overlap with each other, the second light-emitting diode initialization voltage line VALb may be electrically connected to the eighth transistor T8 and the ninth transistor T9 by the first connection pattern CP1. Similarly, by irradiating a laser beam onto an area in which the third light-emitting diode initialization voltage line VALc and the first connection pattern CP1 overlap with each other, the third light-emitting diode initialization voltage line VALc may be electrically connected to the eighth transistor T8 and the ninth transistor T9 by the first connection pattern CP1.

According to some embodiments, the first light-emitting diode initialization voltage line VALa and the second light-emitting diode initialization voltage line VALb may be arranged on different layers from each other. For example, the first light-emitting diode initialization voltage line VALa may be arranged on the second gate insulating layer 105 (see, e.g., FIG. 8), and the second light-emitting diode initialization voltage line VALb may be arranged on a first gate insulating layer 103 (see, e.g., FIG. 8). According to some embodiments, the third light-emitting diode initialization voltage line VALc may be arranged at the same layer (e.g., on the same layer) as the first light-emitting diode initialization voltage line VALa and on a different layer from the second light-emitting diode initialization voltage line VALb. For example, the third light-emitting diode initialization voltage line VALc may be arranged on the second gate insulating layer 105 (see, e.g., FIG. 8). According to some embodiments, the first connection pattern CP1 may be arranged on a different layer from each of the first light-emitting diode initialization voltage line VALa, the second light-emitting diode initialization voltage line VALb, and the third light-emitting diode initialization voltage line VALc. For example, the first connection pattern CP1 may be arranged on an interlayer insulating layer 107 (see, e.g., FIG. 8). The cross-sectional arrangement of each of the first to third light-emitting diode initialization voltage lines VALa to VALc and the first connection pattern CP1 described above may be an example and may be variously changed according to embodiments.

The display apparatus 1 may include the semiconductor pattern 1100 arranged in the first side peripheral area SPA1. The semiconductor pattern 1100 may include the semiconductor layer A8 of the eighth transistor T8 and the semiconductor layer A9 of the ninth transistor T9 of the first repair circuit RC1. The emission control line EML may extend from the display area DA to the first side peripheral area SPA1 and may be arranged to partially overlap with the semiconductor pattern 1100. The semiconductor layer A8 of the eighth transistor T8 may include a channel area in which the emission control line EML overlaps with the semiconductor pattern 1100, and the semiconductor layer A8 of the eighth transistor T8 may include a first impurity area and a second impurity area arranged at both sides of the channel area and doped with impurities. The emission control line EML may include the gate electrode of the eighth transistor T8. The light-emitting diode initialization control line GBL may extend from the display area DA to the first side peripheral area SPA1 and may be arranged to partially overlap with the semiconductor pattern 1100. The semiconductor layer A9 of the ninth transistor T9 may include a channel area in which the light-emitting diode initialization control line GBL overlaps with the semiconductor pattern 1100, and the semiconductor layer A9 of the ninth transistor T9 may include a first impurity area and a second impurity area arranged at both sides of the channel area and doped with impurities. The light-emitting diode initialization control line GBL may include the gate electrode of the ninth transistor T9.

According to some embodiments, the emission control line EML and the light-emitting diode initialization control line GBL may be arranged above the semiconductor pattern 1100. According to some embodiments, each of the emission control line EML and the light-emitting diode initialization control line GBL may be arranged at the same layer (e.g., on the same layer) as the second light-emitting diode initialization voltage line VALb. For example, the semiconductor pattern 1100 may be arranged on a buffer layer 101 (see, e.g., FIG. 8). For example, each of the emission control line EML and the light-emitting diode initialization control line GBL may be arranged on the first gate insulating layer 103 (see, e.g., FIG. 8).

The repair line RL may extend from the display area DA to the first side peripheral area SPA1. In the display area DA, the repair line RL may be electrically connected to the pixel electrode (e.g., the anode) of each of the first light-emitting diode LED1 (see, e.g., FIG. 3A) of the first pixel circuit PC1, the second light-emitting diode LED2 (see, e.g., FIG. 3A) of the second pixel circuit PC2, and the third light-emitting diode LED3 (see, e.g., FIG. 3A) of the third pixel circuit PC3. For example, in the display area DA, the repair line RL may be connected to connection members respectively connected to the pixel electrodes (e.g., the anodes) of the first light-emitting diode LED1 (see, e.g., FIG. 3A) of the first pixel circuit PC1, the second light-emitting diode LED2 (see, e.g., FIG. 3A) of the second pixel circuit PC2, and the third light-emitting diode LED3 (see, e.g., FIG. 3A) of the third pixel circuit PC3.

The repair line RL may be connected to the semiconductor pattern 1100 by a sixth connection pattern CP6 in the first side peripheral area SPA1. The sixth connection pattern CP6 may be connected to the semiconductor pattern 1100 by the contact portion CNT. The sixth connection pattern CP6 may be connected to the repair line RL by the contact portion CNT. An end of the sixth connection pattern CP6 may be connected to the semiconductor layer A8 of the eighth transistor T8 (e.g., the first impurity area of the semiconductor layer A8 of the eighth transistor T8) and the other end of the sixth connection pattern CP6 may be connected to the repair line RL.

The display apparatus 1 may include a second connection pattern CP2 arranged in the first side peripheral area SPA1. The second connection pattern CP2 may be connected to the semiconductor pattern 1100 by the contact portion CNT. The second connection pattern CP2 may be electrically connected to the semiconductor layer A8 of the eighth transistor T8 and the semiconductor layer A9 of the ninth transistor T9. For example, the second connection pattern CP2 may be connected to the semiconductor layer A8 of the eighth transistor T8 (e.g., the second impurity area of the semiconductor layer A8 of the eighth transistor T8) and the semiconductor layer A9 of the ninth transistor T9 (e.g., the first impurity area of the semiconductor layer A9 of the ninth transistor T9) by the contact portion CNT. According to some embodiments, the second connection pattern CP2 may be arranged on the same layer (e.g., the interlayer insulating layer 107 (see, e.g., FIG. 8)) as the first connection pattern CP1. According to some embodiments, the second connection pattern CP2 may be arranged on a different layer (e.g., the first via insulating layer 110 (see, e.g., FIG. 8)) from the first connection pattern CP1.

The repair line RL may be electrically connected to the semiconductor layer A8 of the eighth transistor T8 (e.g., the second impurity area of the semiconductor layer A8 of the eighth transistor T8) and the semiconductor layer A9 of the ninth transistor T9 (e.g., the first impurity area of the semiconductor layer A9 of the ninth transistor T9), the eighth transistor T8 and the ninth transistor T9 being included in the first repair circuit RC1. According to some embodiments, the repair line RL may be electrically connected to the eighth transistor T8 and the ninth transistor T9 by the second connection pattern CP2. The repair line RL may be arranged to overlap with the second connection pattern CP2 to be electrically connected to the second connection pattern CP2. According to some embodiments, the repair line RL may be arranged on the same layer as the first light-emitting diode initialization voltage line VALa. For example, the repair line RL may be arranged on the second gate insulating layer 105 (see, e.g., FIG. 8).

Each of the first compensation capacitor Ccomp1, the second compensation capacitor Ccomp2, and the third compensation capacitor Ccomp3 may be arranged in the first side peripheral area SPA1. Each of the first compensation capacitor Ccomp1, the second compensation capacitor Ccomp2, and the third compensation capacitor Ccomp3 may include a first electrode CEa and a second electrode CEb on the first electrode CEa. The first electrode CEa and the second electrode CEb may be arranged to overlap with each other. According to some embodiments, the first electrode CEa may be arranged on the same layer (e.g., the first gate insulating layer 103 (see, e.g., FIG. 8)) as the emission control line EML, the light-emitting diode initialization control line GBL, and/or the second light-emitting diode initialization voltage line VALb. According to some embodiments, the second electrode CEb may be arranged on the same layer (e.g., the second gate insulating layer 105 (see, e.g., FIG. 8)) as the repair line RL and/or the first light-emitting diode initialization voltage line VALa.

The display apparatus 1 may include a third-1 connection pattern CP3a, a third-2 connection pattern CP3b, and a third-3 connection pattern CP3c arranged in the first side peripheral area SPA1. The third-1 connection pattern CP3a, the third-2 connection pattern CP3b, and the third-3 connection pattern CP3c may be connected to the first compensation capacitor Ccomp1, the second compensation capacitor Ccomp2, and the third compensation capacitor Ccomp3, respectively. For example, the third-1 connection pattern CP3a may be connected to the first electrode CEa of the first compensation capacitor Ccomp1 by the contact portion CNT, the third-2 connection pattern CP3b may be connected to the first electrode CEa of the second compensation capacitor Ccomp2 by the contact portion CNT, and the third-3 connection pattern CP3c may be connected to the first electrode CEa of the third compensation capacitor Ccomp3 by the contact portion CNT.

Each of the first compensation capacitor Ccomp1, the second compensation capacitor Ccomp2, and the third compensation capacitor Ccomp3 may be electrically connected to the eighth transistor T8 and the ninth transistor T9 of the first repair circuit RC1. Each of the third-1 connection pattern CP3a, the third-2 connection pattern CP3b, and the third-3 connection pattern CP3c may be arranged to overlap with the second connection pattern CP2 to be electrically connected to the second connection pattern CP2.

According to some embodiments, the first compensation capacitor Ccomp1 may be electrically connected to the eighth transistor T8 and the ninth transistor T9 by the third-1 connection pattern CP3a and the second connection pattern CP2. For example, the second connection pattern CP2 may be electrically connected to the semiconductor layer A8 of the eighth transistor T8 and the semiconductor layer A9 of the ninth transistor T9, and thus, by irradiating a laser beam onto an area in which the third-1 connection pattern CP3a overlaps with the second connection pattern CP2, the first compensation capacitor Ccomp1 may be electrically connected to the eighth transistor T8 and the ninth transistor T9 by the third-1 connection pattern CP3a and the second connection pattern CP2.

According to some embodiments, the second compensation capacitor Ccomp2 may be electrically connected to the eighth transistor T8 and the ninth transistor T9 by the third-2 connection pattern CP3b and the second connection pattern CP2. For example, by irradiating a laser beam onto an area in which the third-2 connection pattern CP3b and the second connection pattern CP2 overlap with each other, the second compensation capacitor Ccomp2 may be electrically connected to the eighth transistor T8 and the ninth transistor T9 by the third-2 connection pattern CP3b and the second connection pattern CP2.

According to some embodiments, the third compensation capacitor Ccomp3 may be electrically connected to the eighth transistor T8 and the ninth transistor T9 by the third-3 connection pattern CP3c and the second connection pattern CP2. For example, by irradiating a laser beam onto an area in which the third-3 connection pattern CP3c and the second connection pattern CP2 overlap with each other, the third compensation capacitor Ccomp3 may be electrically connected to the eighth transistor T8 and the ninth transistor T9 by the third-3 connection pattern CP3c and the second connection pattern CP2.

According to some embodiments, each of the third-1 connection pattern CP3a, the third-2 connection pattern CP3b, and the third-3 connection pattern CP3c may be arranged above the second connection pattern CP2. For example, when the second connection pattern CP2 is arranged on the interlayer insulating layer 107 (see, e.g., FIG. 8), each of the third-1 connection pattern CP3a, the third-2 connection pattern CP3b, and the third-3 connection pattern CP3c may be arranged on the first via insulating layer 110 (see, e.g., FIG. 8). According to some embodiments, each of the third-1 connection pattern CP3a, the third-2 connection pattern CP3b, and the third-3 connection pattern CP3c may be arranged below the second connection pattern CP2. For example, when the second connection pattern CP2 is arranged on the first via insulating layer 110 (see, e.g., FIG. 8), each of the third-1 connection pattern CP3a, the third-2 connection pattern CP3b, and the third-3 connection pattern CP3c may be arranged on the interlayer insulating layer 107 (see, e.g., FIG. 8).

According to some embodiments, the display apparatus 1 may include a fifth-1 connection pattern CP5a, a fifth-2 connection pattern CP5b, and a third-3 connection pattern CP5c connected to the first compensation capacitor Ccomp1, the second compensation capacitor Ccomp2, and the third compensation capacitor Ccomp3, respectively. FIG. 5 illustrates that the fifth-1 connection pattern CP5a, the fifth-2 connection pattern CP5b, and the fifth-3 connection pattern CP5c are integrally formed with the second electrode CEb of the first compensation capacitor Ccomp1, the second electrode CEb of the second compensation capacitor Ccomp2, and the second electrode CEb of the third compensation capacitor Ccomp3, respectively. However, the disclosure is not limited thereto. According to some other embodiments, the fifth-1 connection pattern CP5a, the fifth-2 connection pattern CP5b, and the fifth-3 connection pattern CP5c may be arranged on the second electrode CEb of the first compensation capacitor Ccomp1, the second electrode CEb of the second compensation capacitor Ccomp2, and the second electrode CEb of the third compensation capacitor Ccomp3, respectively, and may be connected thereto by the contact portion.

The second driving voltage transmission line VLd2 may extend from the display area DA to the first side peripheral area SPA1. Each of the first compensation capacitor Ccomp1, the second compensation capacitor Ccomp2, and the third compensation capacitor Ccomp3 may be electrically connected to the second driving voltage transmission line VLd2. The display apparatus 1 may include a fourth connection pattern CP4 arranged in the first side peripheral area SPA1 and connected to the second driving voltage transmission line VLd2. The fourth connection pattern CP4 may be electrically connected to each of the first compensation capacitor Ccomp1, the second compensation capacitor Ccomp2, and the third compensation capacitor Ccomp3. According to some embodiments, the fourth connection pattern CP4 may be arranged to overlap with the fifth-1 connection pattern CP5a, the fifth-2 connection pattern CP5b, and the fifth-3 connection pattern CP5c to be connected thereto.

For example, the fourth connection pattern CP4 may be electrically connected to the second driving voltage transmission line VLd2 and the fifth-1 connection pattern CP5a may be electrically connected to the first compensation capacitor Ccomp1, and thus, by irradiating a laser beam onto an area in which the fourth connection pattern CP4 and the fifth-1 connection pattern CP5a overlap with each other, the first compensation capacitor Ccomp1 may be electrically connected to the second driving voltage transmission line VLd2. For example, the fourth connection pattern CP4 may be electrically connected to the second driving voltage transmission line VLd2 and the fifth-2 connection pattern CP5b may be electrically connected to the second compensation capacitor Ccomp2, and thus, by irradiating a laser beam onto an area in which the fourth connection pattern CP4 and the fifth-2 connection pattern CP5b overlap with each other, the second compensation capacitor Ccomp2 may be electrically connected to the second driving voltage transmission line VLd2. For example, the fourth connection pattern CP4 may be electrically connected to the second driving voltage transmission line VLd2 and the fifth-3 connection pattern CP5c may be electrically connected to the third compensation capacitor Ccomp3, and thus, by irradiating a laser beam onto an area in which the fourth connection pattern CP4 and the fifth-3 connection pattern CP5c overlap with each other, the third compensation capacitor Ccomp3 may be electrically connected to the second driving voltage transmission line VLd2.

According to some embodiments, the fourth connection pattern CP4 may be arranged at (e.g., on) the same layer (e.g., the interlayer insulating layer 107 (see, e.g., FIG. 8)) as the first connection pattern CP1. According to some embodiments, the fourth connection pattern CP4 may be arranged on a different layer (e.g., the first via insulating layer 110 (see, e.g., FIG. 8)) from the first connection pattern CP1.

Figure 6A:
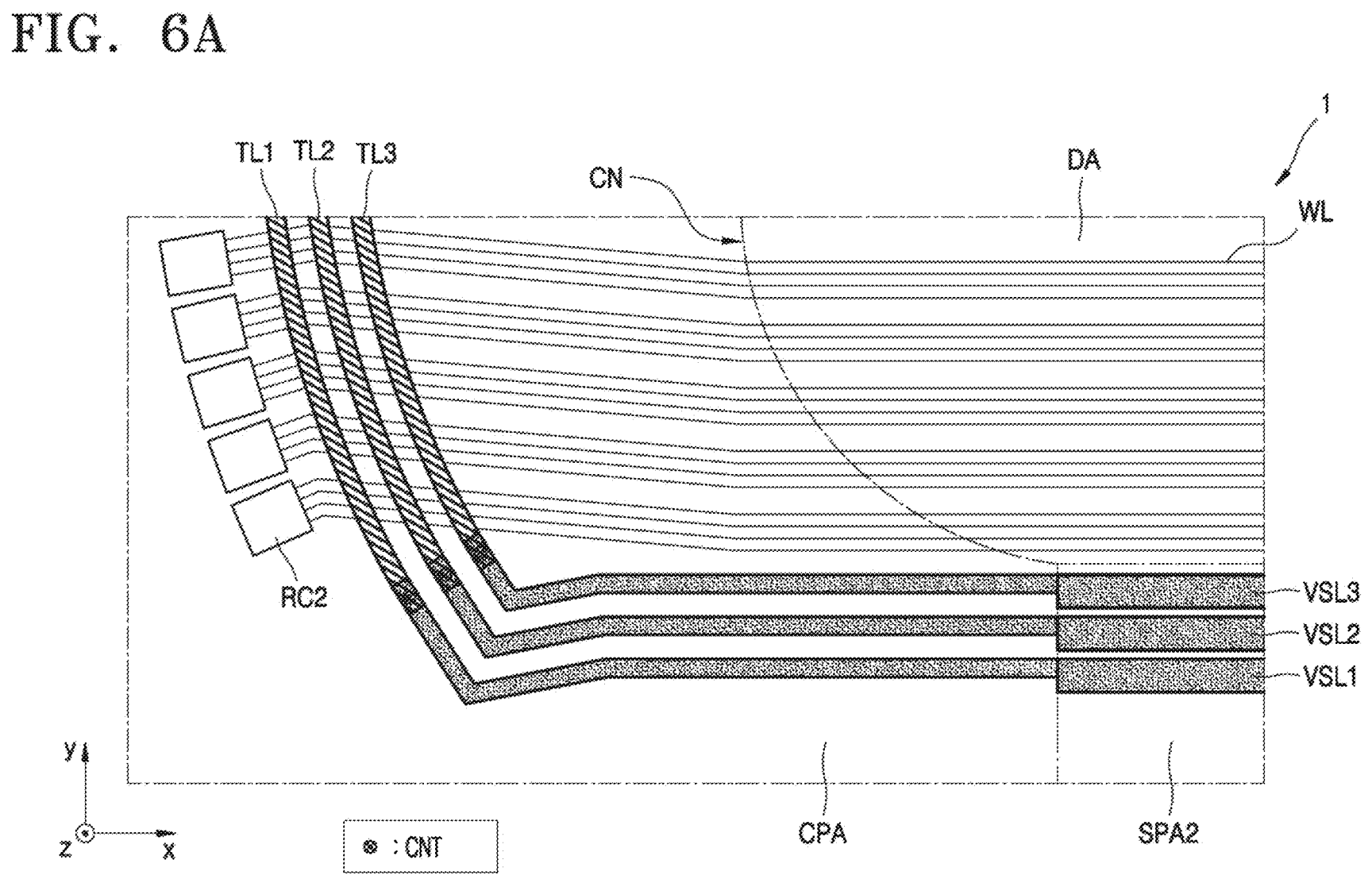
Figure 6B:
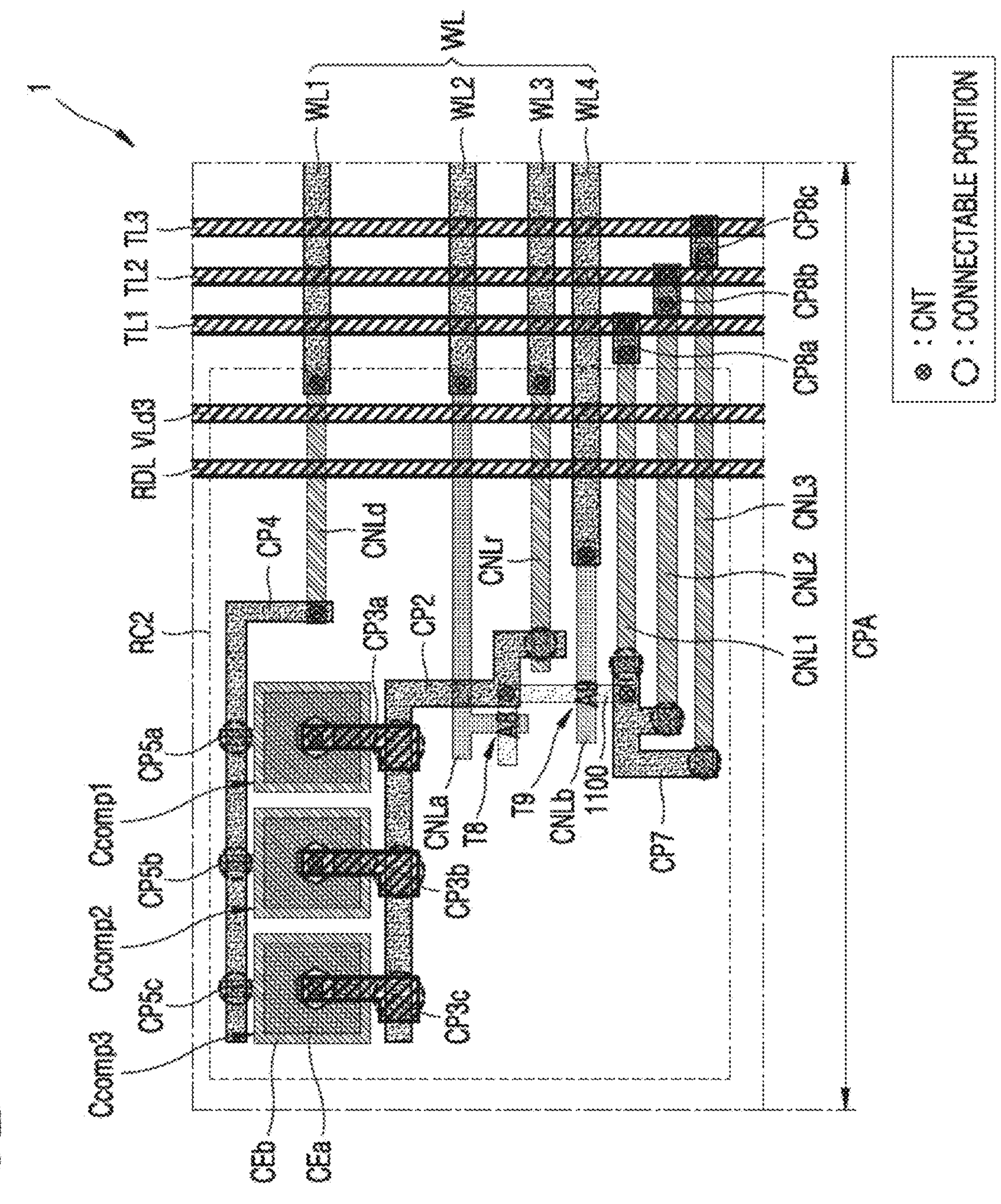
FIG. 6B is a schematic view of the corner peripheral area of FIG. 6A according to some embodiments of the present disclosure.

FIG. 6A is a schematic plan view of the second side peripheral area SPA2 and the corner peripheral area CPA of the display apparatus 1 according to some embodiments of the present disclosure. FIG. 6B is a schematic view of the corner peripheral area CPA of FIG. 6A according to some embodiments of the present disclosure.

The structure of first to third pixel circuits arranged in a row corresponding to the second repair circuit RC2, described with reference to FIGS. 6A and 6B, may be substantially the same as the structure of the first to third pixel circuits PC1 to PC3 arranged in the same row as the first repair circuit RC1, described with reference to FIG. 5.

Referring to FIG. 6A, a plurality of second repair circuits RC2 may be arranged in the corner peripheral area CPA. According to some embodiments, the second repair circuits RC2 may be arranged in a diagonal direction along a −x direction and a +y direction. According to some embodiments, the second repair circuits RC2 may be arranged in a circumferential direction of a round edge of the corner peripheral area CPA. Each second repair circuit RC2 may be electrically connected to the first to third pixel circuits arranged in a row corresponding to the second repair circuit RC2 by a line WL, in the display area DA. The line WL may be arranged in the display area DA and may extend from the display area DA to the corner peripheral area CPA.

The display apparatus 1 may include a first light-emitting diode initialization voltage supply line VSL1, a second light-emitting diode initialization voltage supply line VSL2, and a third light-emitting diode initialization voltage supply line VSL3, a portion of each of which is arranged in the second side peripheral area SPA2. According to some embodiments, the portion of each of the first to third light-emitting diode initialization voltage supply lines VSL1 to VSL3 may extend to the corner peripheral area CPA. The first light-emitting diode initialization voltage supply line VSL1 may transmit the first light-emitting diode initialization voltage Vaint1 (see, e.g., FIG. 3A), the second light-emitting diode initialization voltage supply line VSL2 may transmit the second light-emitting diode initialization voltage Vaint2 (see, e.g., FIG. 3A), and the third light-emitting diode initialization supply line VSL3 may transmit the third light-emitting diode initialization voltage Vaint3 (see, e.g., FIG. 3A).

The first light-emitting diode initialization voltage supply line VSL1 may be electrically connected to the first light-emitting diode initialization voltage line VALa (see, e.g., FIG. 5) located to correspond to the first repair circuit RC1 (see, e.g., FIG. 5) and may be electrically connected to a first light-emitting diode initialization voltage line located to correspond to the second repair circuit RC2, in the display area DA. The second light-emitting diode initialization voltage supply line VSL2 may be electrically connected to the second light-emitting diode initialization voltage line VALb (see, e.g., FIG. 5) located to correspond to the first repair circuit RC1 (see, e.g., FIG. 5) and may be electrically connected to a second light-emitting diode initialization voltage line located to correspond to the second repair circuit RC2, in the display area DA. The third light-emitting diode initialization voltage supply line VSL3 may be electrically connected to the third light-emitting diode initialization voltage line VALc (see, e.g., FIG. 5) located to correspond to the first repair circuit RC1 (see, e.g., FIG. 5) and may be electrically connected to a third light-emitting diode initialization voltage line located to correspond to the second repair circuit RC2, in the display area DA.

The first to third light-emitting diode initialization voltage supply lines VSL1 to VSL3 may be arranged on the same layer as each other. For example, each of the first to third light-emitting diode initialization voltage supply lines VSL1 to VSL3 may be arranged, for example, on the interlayer insulating layer 107 (see, e.g., FIG. 8).

The display apparatus 1 may include a first transmission line TL1 arranged in the corner peripheral area CPA and electrically connected to the first light-emitting diode initialization voltage supply line VSL1 by the contact portion CNT. The display apparatus 1 may include a second transmission line TL2 arranged in corner peripheral area CPA and electrically connected to the second light-emitting diode initialization voltage supply line VSL2 by the contact portion CNT. The display apparatus 1 may include a third transmission line TL3 arranged in corner peripheral area CPA and electrically connected to the third light-emitting diode initialization voltage supply line VSL3 by the contact portion CNT. Each of the first transmission line TL1, the second transmission line TL2, and the third transmission line TL3 may be arranged in the corner peripheral area CPA. The first transmission line TL1 may transmit the first light-emitting diode initialization voltage Vaint1 (see, e.g., FIG. 3A), the second transmission line TL2 may transmit the second light-emitting diode initialization voltage Vaint2 (see, e.g., FIG. 3A), and the third transmission line TL3 may transmit the third light-emitting diode initialization voltage line Vaint3 (see, e.g., FIG. 3A). As described below with reference to FIG. 6B, each of the first to third transmission lines TL1 to TL3 may be electrically connected to the second repair circuit RC2. According to some embodiments, each of the first to third transmission lines TL1 to TL3 may extend in a circumferential direction of a round edge of the corner peripheral area CPA.

According to some embodiments, the first to third transmission lines TL1 to TL3 may be arranged on the first to third light-emitting diode initialization voltage supply lines VSL1 to VSL3, respectively. For example, each of the first to third transmission lines TL1 to TL3 may be arranged on the first via insulating layer 110 (see, e.g., FIG. 8).

The second repair circuit RC2 of FIG. 6B may be substantially the same as the first repair circuit RC1 illustrated in FIG. 5, except for some differences. Hereinafter, the same aspects are not repeatedly described, and different aspects are mainly described. For convenience of explanation, FIG. 6B illustrates the eighth transistor T8 and the ninth transistor T9 and the first to third compensation capacitors Ccomp1 to Ccomp3 of the second repair circuit RC2, and the remaining transistors and the storage capacitor are omitted in FIG. 6B.

Referring to FIG. 6B, the second repair circuit RC2 may be electrically connected to the first to third pixel circuits arranged in the row corresponding to the second repair circuit RC2 by the line WL, in the display area DA (see, e.g., FIG. 6A). The line WL extending from the display area DA may include a first line WL1, a second line WL2, a third line WL3, and a fourth line WL4.

In the corner peripheral area CPA, the third driving voltage transmission line VLd3 electrically connected to the second repair circuit RC2 may be electrically connected to the first line WL1. The first line WL1 may transmit a driving voltage ELVDD. The first line WL1 may be electrically connected to the second driving voltage transmission line VLd2 electrically connected to the first to third pixel circuits arranged in the row corresponding to the second repair circuit RC2. According to some embodiments, the first line WL1 may be connected to a driving voltage connection line CNLd by the contact portion CNT, and the driving voltage connection line CNLd may be connected to the third driving voltage transmission line VLd3 by the contact portion CNT. The driving voltage connection line CNLd may be connected to the fourth connection pattern CP4 by the contact portion CNT.

Each of the first to third compensation capacitors Ccomp1 to CComp3 of the second repair circuit RC2 may be electrically connected to the driving voltage connection line CNLd. The fourth connection pattern CP4 may be connected to the driving voltage connection line CNLd and may be electrically connected to each of the first to third compensation capacitors Ccomp1 to Ccomp3. According to some embodiments, the fourth connection pattern CP4 may be arranged to overlap with the fifth-1 connection pattern CP5a, the fifth-2 connection pattern CP5b, and the fifth-3 connection pattern CP5c to be connected thereto. For example, by irradiating a laser beam onto an area in which the fourth connection pattern CP4 and the fifth-1 connection pattern CP5a overlap with each other in a repair process, the driving voltage ELVDD may be transmitted to the first compensation capacitor Ccomp1 of the second repair circuit RC2 arranged in the corner peripheral area CPA. Similarly, by irradiating a laser beam onto an area in which the fourth connection pattern CP4 and the fifth-2 connection pattern CP5b overlap each with other in a repair process, the driving voltage ELVDD (see, e.g., FIG. 2) may be transmitted to the second compensation capacitor Ccomp2 of the second repair circuit RC2 arranged in the corner peripheral area CPA.

The semiconductor pattern 1100 of the second repair circuit RC2 may include the semiconductor layer A8 of the eighth transistor T8 and the semiconductor layer A9 of the ninth transistor T9.

The second line WL2 may transmit the emission control signal EM (see, e.g., FIG. 2). The second line WL2 may be electrically connected to an emission control line electrically connected to the first to third pixel circuits arranged in the row corresponding to the second repair circuit RC2. According to some embodiments, the second line WL2 may be connected to an emission control connection line CNLa by the contact portion CNT, and a portion of the emission control connection line CNLa may overlap with the semiconductor pattern 1100 of the second repair circuit RC2. The semiconductor layer A8 of the eighth transistor T8 may include a channel area in which the emission control connection line CNLa overlaps with the semiconductor pattern 1100, and the semiconductor layer A8 of the eighth transistor T8 may include a first impurity area and a second impurity area arranged at both sides of the channel area and doped with impurities. The emission control connection line CNLa may include the gate electrode of the eighth transistor T8.

The third line WL3 may be electrically connected to a repair line electrically connected to each of the first to third pixel circuits arranged in the row corresponding to the second repair circuit RC2. The third line WL3 may be connected to a repair connection line CNLr by the contact portion CNT. The repair connection line CNLr may be electrically connected to the semiconductor layer A8 of the eighth transistor T8 (e.g., the second impurity area of the semiconductor layer A8 of the eighth transistor T8) and the semiconductor layer A9 of the ninth transistor T9 (e.g., the first impurity area of the semiconductor layer A9 of the ninth transistor T9), the eighth transistor T8 and the ninth transistor T9 being included in the second repair circuit RC2.

According to some embodiments, the repair connection line CNLr may be electrically connected to the eighth transistor T8 and the ninth transistor T9 by the second connection pattern CP2. The repair connection line CNLr may be arranged to overlap with the second connection pattern CP2 to be electrically connected to the second connection pattern CP2.

The fourth line WL4 may transmit the light-emitting diode initialization control signal GB (see, e.g., FIG. 2). The fourth line WL4 may be electrically connected to a light-emitting diode initialization control line electrically connected to the first to third pixel circuits arranged in the row corresponding to the second repair circuit RC2. According to some embodiments, the fourth line WL4 may be connected to an initialization control connection line CNLb by the contact portion CNT, and a portion of the initialization control connection line CNLb may overlap with the semiconductor pattern 1100 of the second repair circuit RC2. The semiconductor layer A9 of the ninth transistor T9 may include a channel area in which the initialization control connection line CNLb overlaps with the semiconductor pattern 1100 and may include a first impurity area and a second impurity area arranged at both sides of the channel area and doped with impurities. The initialization control connection line CNLb may include the gate electrode of the ninth transistor T9.

The display apparatus 1 may include a seventh connection pattern CP7 arranged in the corner peripheral area CPA. The seventh connection pattern CP7 may be connected to the semiconductor pattern 1100 by the contact portion CNT. The seventh connection pattern CP7 may be electrically connected to the semiconductor layer A8 of the eighth transistor T8 and the semiconductor layer A9 of the ninth transistor T9, the eighth transistor T8 and the ninth transistor T9 being included in the second repair circuit RC2. For example, the seventh connection pattern CP7 may be connected to the semiconductor layer A9 of the ninth transistor T9 (e.g., the second impurity area of the semiconductor layer A9 of the ninth transistor T9) by the contact portion CNT.

A first connection line CNL1 may be electrically connected to the first transmission line TL1 and may transmit the first light-emitting diode initialization voltage Vaint1 (see, e.g., FIG. 3A). A second connection line CNL2 may be electrically connected to the second transmission line TL2 and may transmit the second light-emitting diode initialization voltage Vaint2 (see, e.g., FIG. 3A). A third connection line CNL3 may be electrically connected to the third transmission line TL3 and may transmit the third light-emitting diode initialization voltage Vaint3 (see, e.g., FIG. 3A). According to some embodiments, the first transmission line TL1 and the first connection line CNL1 may be connected to each other by an eighth-1 connection pattern CP8a, the second transmission line TL2 and the second connection line CNL2 may be connected to each other by an eighth-2 connection pattern CP8b, and the third transmission line TL3 and the third connection line CNL3 may be connected to each other by an eighth-3 connection pattern CP8c.

The first connection line CNL1, the second connection line CNL2, and the third connection line CNL3 may be arranged to be spaced apart from each other in a plan view. Each of the first to third connection lines CNL1 to CNL3 may be electrically connected to the eighth transistor T8 and the ninth transistor T9 of the second repair circuit RC2. Each of the first to third connection lines CNL1 to CNL3 may be arranged to overlap with the seventh connection pattern CP7 to be electrically connected to the seventh connection pattern CP7.

For example, by irradiating a laser beam onto an area in which the first connection line CNL1 overlaps with the seventh connection pattern CP7, the first transmission line TL1 may be electrically connected to the eighth transistor T8 and the ninth transistor T9 of the second repair circuit RC2 by the first connection line CNL1 and the seventh connection pattern CP7. Thus, the first light-emitting diode initialization voltage Vaint1 (see, e.g., FIG. 3A) may be transmitted to the second repair circuit RC2. Similarly, by irradiating a laser beam onto an area in which the second connection line CNL2 overlaps with the seventh connection pattern CP7, the second transmission line TL2 may be electrically connected to the eighth transistor T8 and the ninth transistor T9 of the second repair circuit RC2 by the second connection line CNL2 and the seventh connection pattern CP7. Thus, the second light-emitting diode initialization voltage Vaint2 (see, e.g., FIG. 3A) may be transmitted to the second repair circuit RC2. Similarly, by irradiating a laser beam onto an area in which the third connection line CNL3 overlaps with the seventh connection pattern CP7, the third transmission line TL3 may be electrically connected to the eighth transistor T8 and the ninth transistor T9 of the second repair circuit RC2 by the third connection line CNL3 and the seventh connection pattern CP7. Thus, the third light-emitting diode initialization voltage Vaint3 (see, e.g., FIG. 3A) may be transmitted to the second repair circuit RC2.

According to some embodiments, each of the first to fourth lines WL1 to WL4 may be arranged below the first to third transmission lines TL1 to TL3. According to some embodiments, each of the first to fourth lines WL1 to WL4 may be arranged at (e.g., on) the same layer as the seventh connection pattern CP7. For example, each of the first to fourth lines WL1 to WL4 may be arranged on the interlayer insulating layer 107 (see, e.g., FIG. 8).

According to some embodiments, the seventh connection pattern CP7 may be arranged at (e.g., on) the same layer (e.g., the interlayer insulating layer 107 (see, e.g., FIG. 8)) as the first to fourth lines WL1 to WL4.

According to some embodiments, each of the first to third connection lines CNL1 to CNL3 may be arranged below the seventh connection pattern CP7. According to some embodiments, each of the first to third connection lines CNL1 to CNL3 may be arranged below the first to third transmission lines TL1 to TL3. For example, each of the first to third connection lines CNL1 to CNL3 may be arranged on the second gate insulating layer 105 (see, e.g., FIG. 8).

According to some embodiments, the emission control connection line CNLa and the initialization control connection line CNLb may be arranged above the semiconductor pattern 1100 and below the first to fourth lines WL1 to WL4. For example, the emission control connection line CNLa and the initialization control connection line CNLb may be arranged on the first gate insulating layer 103 (see, e.g., FIG. 8).

Figure 7A:
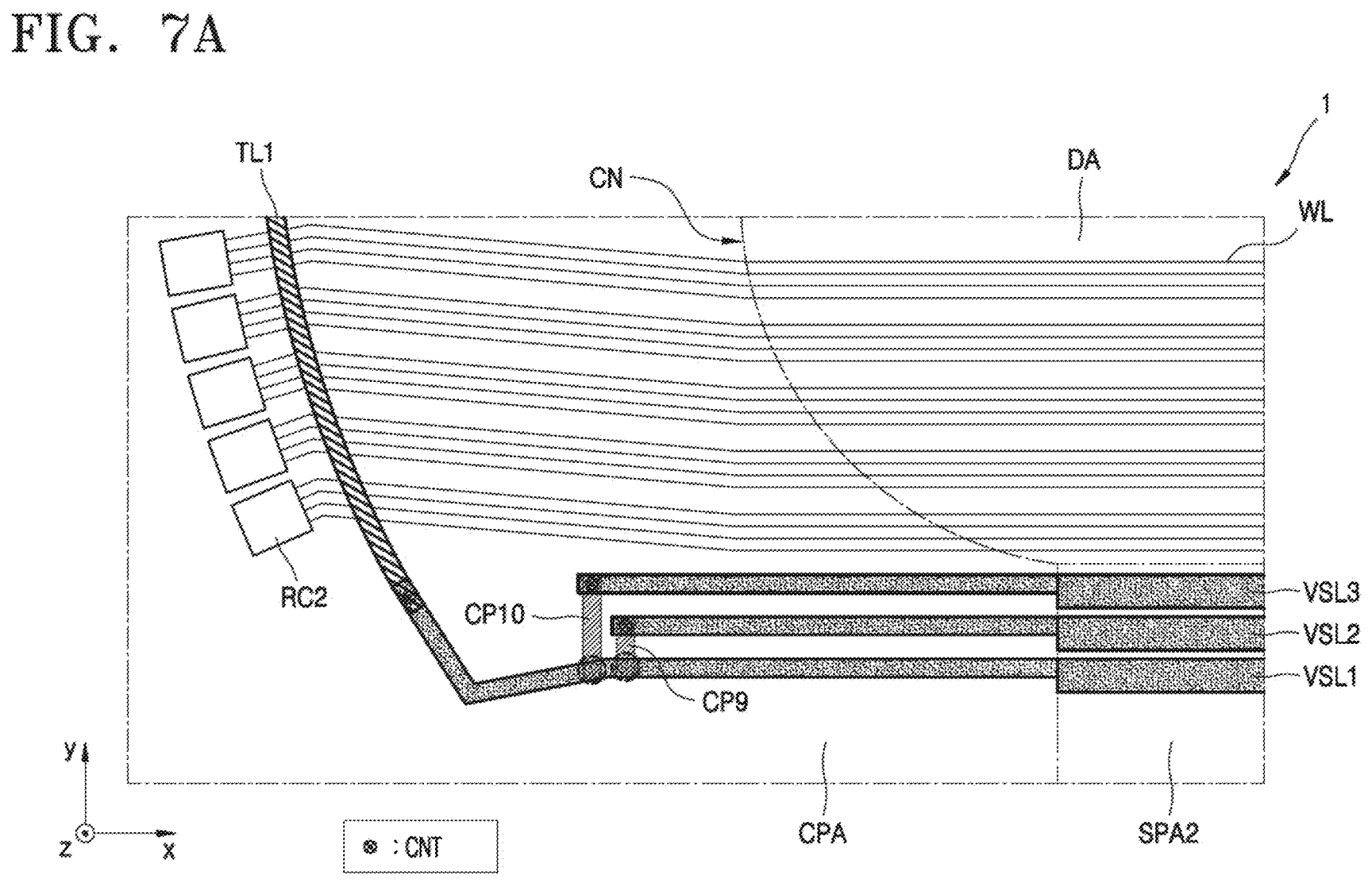

FIG. 7A is a schematic plan view of the second side peripheral area SPA2 and the corner peripheral area CPA of the display apparatus 1 according to some embodiments of the present disclosure. In FIG. 7A, the same aspects as described with reference to FIG. 6A will not be repeatedly described and differences will be mainly described.

Referring to FIG. 7A, the display apparatus 1 may include the first transmission line TL1 arranged in the corner peripheral area CPA and electrically connected to the first light-emitting diode initialization voltage supply line VSL1 by the contact portion CNT. According to some embodiments, the first transmission line TL1 may extend in a circumferential direction of a round edge of the corner peripheral area CPA.

According to some embodiments, the first transmission line TL1 may be arranged on the first light-emitting diode initialization voltage supply line VSL1. For example, the first transmission line TL1 may be arranged on the first via insulating layer 110 (see, e.g., FIG. 8). As described below with reference to FIG. 7B, the first transmission line TL1 may be electrically connected to the second repair circuit RC2.

The second light-emitting diode initialization voltage supply line VSL2 may be electrically connected to the first light-emitting diode initialization voltage supply line VSL1. According to some embodiments, the second light-emitting diode initialization voltage supply line VSL2 may be electrically connected to the first light-emitting diode initialization voltage supply line VSL1 by a ninth connection pattern CP9. The ninth connection pattern CP9 may be connected to the second light-emitting diode initialization voltage supply line VSL2 by the contact portion CNT and may be arranged to overlap with the first light-emitting diode initialization voltage supply line VSL1 to be connected thereto. For example, the second light-emitting diode initialization voltage supply line VSL2 may be electrically connected to the first transmission line TL1 by a portion of the first light-emitting diode initialization voltage supply line VSL1. For example, the second light-emitting diode initialization voltage supply line VSL2 may be electrically connected to the second repair circuit RC2 by a portion of the first light-emitting diode initialization voltage supply line VSL1 and the first transmission line TL1.

The ninth connection pattern CP9 may be arranged in the corner peripheral area CPA. The ninth connection pattern CP9 may be arranged below the first light-emitting diode initialization voltage supply line VSL1 and the second light-emitting diode initialization voltage supply line VSL2. For example, the ninth connection pattern CP9 may be arranged on the first gate insulating layer 103 (see, e.g., FIG. 8) or the second gate insulating layer 105 (see, e.g., FIG. 8).

The third light-emitting diode initialization voltage supply line VSL3 may be electrically connected to the first light-emitting diode initialization voltage supply line VSL1. According to some embodiments, the third light-emitting diode initialization voltage supply line VSL3 may be electrically connected to the first light-emitting diode initialization voltage supply line VSL1 by a tenth connection pattern CP10. The tenth connection pattern CP10 may be connected to the third light-emitting diode initialization voltage supply line VSL3 by the contact portion CNT and may be arranged to overlap with the first light-emitting diode initialization voltage supply line VSL1 to be connected thereto. For example, the third light-emitting diode initialization voltage supply line VSL3 may be electrically connected to the first transmission line TL1 by a portion of the first light-emitting diode initialization voltage supply line VSL1. For example, the third light-emitting diode initialization voltage supply line VSL3 may be electrically connected to the second repair circuit RC2 by a portion of the first light-emitting diode initialization voltage supply line VSL1 and the first transmission line TL1.

The tenth connection pattern CP10 may be arranged in the corner peripheral area CPA. The tenth connection pattern CP10 may be arranged below the first light-emitting diode initialization voltage supply line VSL1 and the third light-emitting diode initialization voltage supply line VSL3. For example, the tenth connection pattern CP10 may be arranged on the first gate insulating layer 103 (see, e.g., FIG. 8) or the second gate insulating layer 105 (see, e.g., FIG. 8).

According to some embodiments, when the first pixel is a defective pixel from among the first to third pixels arranged in the row corresponding to the second repair circuit RC2, the first transmission line TL1 may be connected to the second repair circuit RC2 and electrically connected to the first light-emitting diode initialization voltage supply line VSL1 and may transmit the first light-emitting diode initialization voltage Vaint1, as described with reference to FIGS. 7A and 7B.

According to some embodiments, when the second pixel is a defective pixel from among the first to third pixels arranged in the row corresponding to the second repair circuit RC2, a laser beam may be irradiated to separate and cut a portion of the first light-emitting diode initialization voltage supply line VSL1 arranged in the second side peripheral area SPA2, and a laser beam may be irradiated onto an area in which the remaining portion of the first light-emitting diode initialization voltage supply line VSL1 electrically connected to the first transmission line TL1 overlaps with the second light-emitting diode initialization voltage supply line VSL2 to electrically connect the first transmission line TL1 to the second light-emitting diode initialization voltage supply line VSL2, so that the first transmission line TL1 may transmit the second light-emitting diode initialization voltage Vaint2 to the second repair circuit RC2. For example, according to some embodiments, when the third pixel is a defective pixel from among the first to third pixels arranged in the row corresponding to the second repair circuit RC2, a laser beam may be irradiated to separate and cut a portion of the first light-emitting diode initialization voltage supply line VSL1 arranged in the second side peripheral area SPA2, and a laser beam may be irradiated onto an area in which the remaining portion of the first light-emitting diode initialization voltage supply line VSL1 electrically connected to the first transmission line TL1 overlaps with the third light-emitting diode initialization voltage supply line VSL3 to electrically connect the first transmission line TL1 to the third light-emitting diode initialization voltage supply line VSL3, so that the first transmission line TL1 may transmit the third light-emitting diode initialization voltage Vaint3 to the second repair circuit RC2.

Figure 7B:
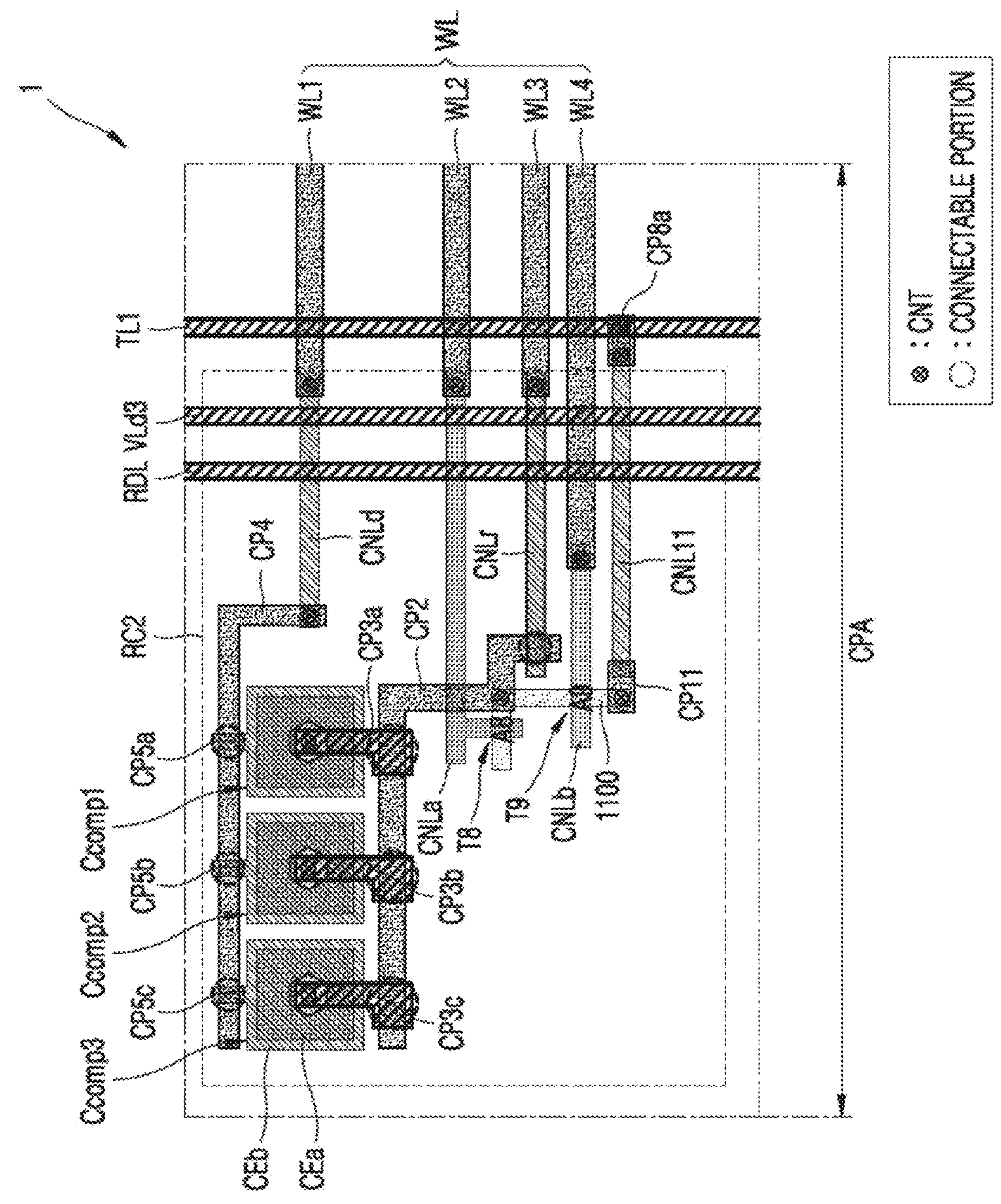
FIG. 7B is a schematic view of the corner peripheral area of FIG. 7A according to some embodiments of the present disclosure.

FIG. 7B is a schematic view of the corner peripheral area CPA of FIG. 7A according to some embodiments of the present disclosure. In FIG. 7B, the same aspects as described with reference to FIG. 6B will not be repeatedly described and differences will be mainly described.

Referring to FIG. 7B, a connection line CNL11 may connect the first transmission line TL1 to the ninth transistor T9 of the second repair circuit RC2, and thus, a voltage transmitted from the first transmission line TL1 may be transmitted to the ninth transistor T9 of the second repair circuit RC2. For example, when the first light-emitting diode initialization voltage supply line VSL1 (see, e.g., FIG. 7A) arranged in the second side peripheral area SPA2 is electrically connected to the first transmission line TL1, the first light-emitting diode initialization voltage Vaint1 may be transmitted to the ninth transistor T9 of the second repair circuit RC2.

For example, when a portion of the first light-emitting diode initialization voltage supply line VSL1 (see, e.g., FIG. 7A) arranged in the second side peripheral area SPA2 is separated and electrically insulated from the first transmission line TL1 and the second light-emitting diode initialization voltage supply line VSL2 (see, e.g., FIG. 7A) is electrically connected to the first transmission line TL1, the second light-emitting diode initialization voltage Vaint2 may be transmitted to the ninth transistor T9 of the second repair circuit RC2. For example, when a portion of the first light-emitting diode initialization voltage supply line VSL1 (see, e.g., FIG. 7A) arranged in the second side peripheral area SPA2 is separated and electrically insulated from the first transmission line TL1 and the third light-emitting diode initialization voltage supply line VSL3 (see, e.g., FIG. 7A) is electrically connected to the first transmission line TL1, the third light-emitting diode initialization voltage Vaint3 may be transmitted to the ninth transistor T9 of the second repair circuit RC2.

According to some embodiments, the first transmission line TL1 and the connection line CNL11 may be connected to each other by the eighth-1 connection pattern CP8a. According to some embodiments, the connection line CNL11 and the semiconductor pattern 1100 may be connected by an eleventh connection pattern CP11.

Figure 8:
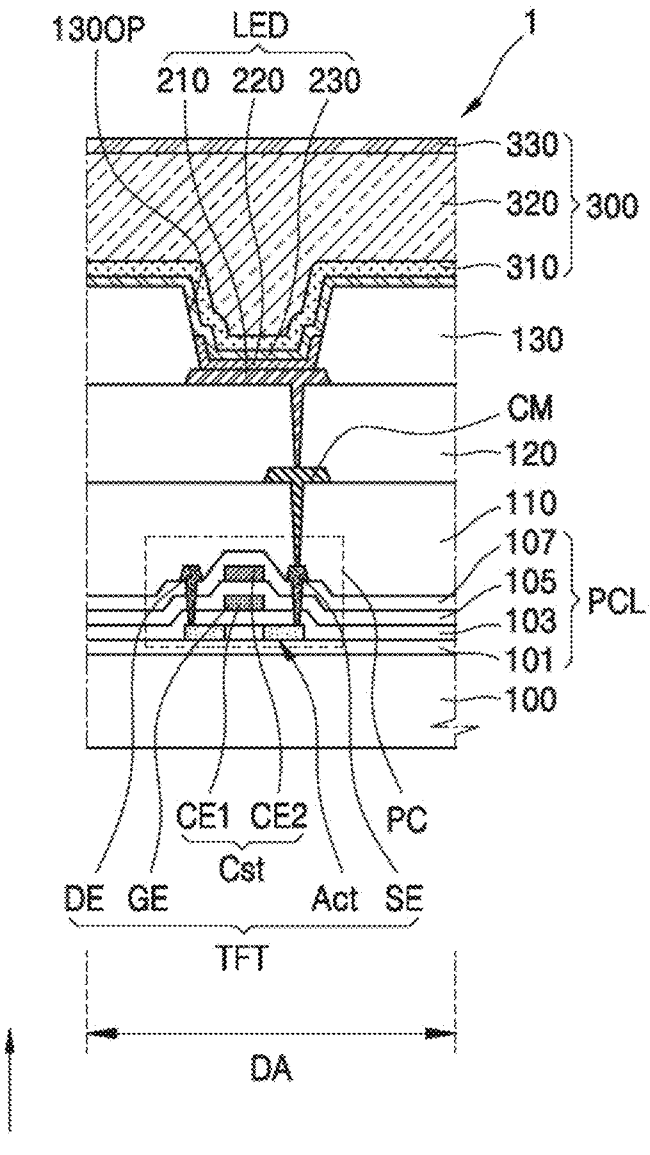
FIG. 8 is a schematic cross-sectional view of a display area of a display apparatus according to some embodiments of the present disclosure.

FIG. 8 is a schematic cross-sectional view of a portion of the display apparatus 1 according to some embodiments of the present disclosure.

Referring to FIG. 8, the display apparatus 1 may include a substrate 100, a pixel circuit layer PCL, a light-emitting diode LED, and an encapsulation member 300. According to some embodiments, the substrate 100 may include glass.

According to some embodiments, the substrate 100 may include polymer resins, such as polyethersulfone, polyacrylate, polyetherimide, polyethylene naphthalate, polyethylene terephthalate, polyphenylene sulfide, polyimide, polycarbonate, cellulose tri-acetate, or cellulose acetate propionate. According to some embodiments, the substrate 100 may have a layered structure including a base layer and a barrier layer including the polymer resins described above. Hereinafter, the case where the substrate 100 includes glass will be mainly described in detail.

The pixel circuit layer PCL may be arranged on the substrate 100. The pixel circuit layer PCL may include a buffer layer 101, a first gate insulating layer 103, a second gate insulating layer 105, an interlayer insulating layer 107, and a pixel circuit PC including a thin-film transistor TFT.

The pixel circuit PC may include at least one thin-film transistor TFT and a storage capacitor Cst. The thin-film transistor TFT may be arranged in the display area DA. The thin-film transistor TFT may be the first transistor T1 or the sixth transistor T6 of the pixel circuit PC described with reference to FIG. 2, but is not limited thereto. The thin-film transistor TFT may include a semiconductor layer Act, a gate electrode GE, a source electrode SE, and a drain electrode DE.

The buffer layer 101 may be arranged on the substrate 100 and may planarize an upper surface of the substrate 100 and block or substantially reduce introduction of impurities from the substrate 100. The buffer layer 101 may include an inorganic insulating material, such as silicon oxide ($SiO_x$), silicon nitride ($SiN_x$), and silicon oxynitride (SiON). The buffer layer 101 may include a single layer or a multi-layered structure including the inorganic insulating material described above.

The semiconductor layer Act may be arranged on the buffer layer 101. The semiconductor layer Act may include an oxide semiconductor and/or a silicon semiconductor. When the semiconductor layer Act includes an oxide semiconductor, the semiconductor layer Act may include, for example, oxide of at least one material selected from among the group consisting of In, Ga, Sn, Zr, V, Hf, Cd, Ge, Cr, Ti, and Zn. For example, the semiconductor layer Act may include an InSnZnO (ITZO) semiconductor layer, an InGaZnO (IGZO) semiconductor layer, etc. When the semiconductor layer Act includes a silicon semiconductor, the semiconductor layer Act may include, for example, amorphous silicon or low temperature poly-silicon (LTPS). The semiconductor pattern 1100 described with reference to FIG. 5 may be formed in the same process as the semiconductor layer Act. For example, the semiconductor pattern 1100 may include the same material as the semiconductor layer Act and may be arranged at (e.g., on) the same layer (e.g., the buffer layer 101) as the semiconductor layer Act.

The first gate insulating layer 103 may be arranged on the buffer layer 101. The first gate insulating layer 103 may be arranged on the semiconductor layer Act. The first gate insulating layer 103 may be arranged between the semiconductor layer Act and the gate electrode GE. The first gate insulating layer 103 may include, for example, an inorganic insulating material, such as $SiO_2$, $SiN_x$, SiON, aluminum oxide ($Al_2O_3$), titanium oxide ($TiO_2$), tantalum oxide ($Ta_2O_5$), hafnium oxide ($HfO_2$), or zinc oxide (ZnO).

The gate electrode GE may be arranged on the first gate insulating layer 103. The gate electrode GE may overlap with a channel area of the semiconductor layer Act. The gate electrode GE may include a low-resistance metal material. For example, the gate electrode GE may include a single layer or layers including one or more metals selected from among Al, Pt, Pd, Ag, Mg, Au, Ni, Nd, Ir, Cr, Ni, Ca, Mo, Ti, W, and Cu. The gate electrode GE may be connected to a gate line configured to apply an electrical signal to the gate electrode GE.

The first electrode CEa of each of the first to third compensation capacitors Ccomp1 to Ccomp3, and each of the light-emitting diode initialization control line GBL and the emission control line EML, described with reference to FIG. 5, may be formed in the same process as the gate electrode GE. For example, the first electrode CEa of each of the first to third compensation capacitors Ccomp1, Ccomp2, and Ccomp3, and each of the light-emitting diode initialization control line GBL and the emission control line EML may include the same material as the gate electrode GE and may be arranged at (e.g., on) the same layer (e.g., the first gate insulating layer 103) as the gate electrode GE. According to some embodiments, the second light-emitting diode initialization voltage line VALb described with reference to FIG. 5 may be formed in the same process as the gate electrode GE. For example, the second light-emitting diode initialization voltage line VALb may include the same material as the gate electrode GE and may be arranged at (e.g., on) the same layer (e.g., the first gate insulating layer 103) as the gate electrode GE.

The second gate insulating layer 105 may be arranged on the first gate insulating layer 103. The second gate insulating layer 105 may cover the gate electrode GE. Similarly to the first gate insulating layer 103, the second gate insulating layer 105 may include an inorganic insulating material, such as $SiO_2$, $SiN_x$, SiON, $Al_2O_3$, $TiO_2$, $Ta_2O_5$, $HfO_2$, ZnO, or the like.

An upper electrode CE2 of the storage capacitor Cst may be arranged above the second gate insulating layer 105. According to some embodiments, the upper electrode CE2 may overlap with the gate electrode GE. Here, the gate electrode GE and the upper electrode CE2 overlapping with each other with the second gate insulating layer 105 therebetween may form the storage capacitor Cst. For example, the gate electrode GE may function as a lower electrode CE1 of the storage capacitor Cst. As described above, the storage capacitor Cst and the thin-film transistor TFT may overlap with each other. According to some other embodiments, the storage capacitor Cst and the thin-film transistor TFT may not overlap with each other.

Each of the second electrode CEb of each of the first to third compensation capacitors Ccomp1, Ccomp2, and Ccomp3, the second driving voltage transmission line VLd2, and the repair line RL described with reference to FIG. 5 may be formed in the same process as the upper electrode CE2 of the storage capacitor Cst. For example, each of the second electrode CEb of each of the first to third compensation capacitors Ccomp1, Ccomp2, and Ccomp3, the second driving voltage transmission line VLd2, and the repair line RL may include the same material as the upper electrode CE2 of the storage capacitor Cst and may be arranged at (e.g., on) the same layer (e.g., the second gate insulating layer 105) as the upper electrode CE2 of the storage capacitor Cst. According to some embodiments, each of the first light-emitting diode initialization voltage line VALa and the second light-emitting diode initialization voltage line VALb described with reference to FIG. 5 may be formed in the same process as the upper electrode CE2 of the storage capacitor Cst. For example, each of the first light-emitting diode initialization voltage line VALa and the second light-emitting diode initialization voltage line VALb may include the same material as the upper electrode CE2 of the storage capacitor Cst and may be arranged at (e.g., on) the same layer (e.g., the second gate insulating layer 105) as the upper electrode CE2 of the storage capacitor Cst.

The interlayer insulating layer 107 may be arranged on the second gate insulating layer 105. The interlayer insulating layer 107 may cover the upper electrode CE2. The interlayer insulating layer 107 may include $SiO_2$, $SiN_x$, SiON, $Al_2O_3$, $TiO_2$, $Ta_2O_5$, $HfO_2$, ZnO, or the like. The interlayer insulating layer 107 may include a single layer or layers including the inorganic insulating material described above.

Each of the source electrode SE and the drain electrode DE may be arranged on the interlayer insulating layer 107. The source electrode SE and the drain electrode DE may be electrically connected to the semiconductor layer Act through a contact hole formed in the first gate insulating layer 103, the second gate insulating layer 105, and the interlayer insulating layer 107. The source electrode SE and the drain electrode DE may include a highly conductive material. At least one of the source electrode SE and the drain electrode DE may include a conductive material including Mo, Al, Cu, Ti, or the like and may include layers or a single layer including the material described above. According to some embodiments, at least one of the source electrode SE and the drain electrode DE may have a layered structure including Ti/Al/Ti layers.

According to some embodiments, each of the first connection pattern CP1, the second connection pattern CP2, the fourth connection pattern CP4, and the sixth connection pattern CP6 described with reference to FIG. 5 may be formed in the same process as the source electrode SE and the drain electrode DE. For example, each of the first connection pattern CP1, the second connection pattern CP2, the fourth connection pattern CP4, and the sixth connection pattern CP6 may include the same material as the source electrode SE and the drain electrode DE and may be arranged at (e.g., on) the same layer (e.g., the interlayer insulating layer 107) as the source electrode SE and the drain electrode DE. According to some embodiments, each of the first to third light-emitting diode initialization voltage supply lines VSL1, VSL2, and VSL3 described with reference to FIG. 6A may be formed in the same process as the source electrode SE and the drain electrode DE. For example, each of the first to third light-emitting diode initialization voltage supply lines VSL1, VSL2, and VSL3 may include the same material as the source electrode SE and the drain electrode DE and may be arranged at (e.g., on) the same layer (e.g., the interlayer insulating layer 107) as the source electrode SE and the drain electrode DE.

The display apparatus 1 may further include at least one via insulating layer arranged on the pixel circuit layer PCL. According to some embodiments, the display apparatus 1 may include a first via insulating layer 110 and a second via insulating layer 120 arranged on the pixel circuit layer PCL.

The first via insulating layer 110 may be arranged on the pixel circuit layer PCL. The first via insulating layer 110 may cover the pixel circuit PC. The first via insulating layer 110 may be arranged on the interlayer insulating layer 107. The first via insulating layer 110 may be arranged on the source electrode SE and the drain electrode DE. The second via insulating layer 120 may be arranged on the first via insulating layer 110 and may cover a connection electrode CM described below.

Each of the first via insulating layer 110 and the second via insulating layer 120 may be referred to as a planarization insulating layer providing a planarized upper surface. Each of the first via insulating layer 110 and the second via insulating layer 120 may include an organic insulating layer. Each of the first via insulating layer 110 and the second via insulating layer 120 may include an organic material. Each of the first via insulating layer 110 and the second via insulating layer 120 may include an organic insulating material, such as a general-purpose polymer such as polymethylmethacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a blend thereof. The first via insulating layer 110 and the second via insulating layer 120 may planarize an upper surface of the pixel circuit PC and may thus planarize a surface on which the light-emitting diode LED is located.

According to some embodiments, the display apparatus 1 may further include the connection electrode CM arranged on the first via insulating layer 110 in the display area DA. The connection electrode CM may be arranged between the first via insulating layer 110 and the second via insulating layer 120. The connection electrode CM may include a conductive material including Mo, Al, Cu, Ti, or the like and may include layers or a single layer including the material described above. According to some embodiments, the connection electrode CM may have a layered structure including Ti/Al/Ti layers. The second via insulating layer 120 may be arranged on the first via insulating layer 110 and may cover the connection electrode CM.

According to some embodiments, each of the first to third data lines DL1, DL2, and DL3, the repair data line RDL, the first driving voltage transmission line VLd1, and the third driving voltage transmission line VLd3 described with reference to FIG. 5 may be formed in the same process as the source electrode SE and the drain electrode DE. For example, each of the first to third data lines DL1 to DL3, the repair data line RDL, the first driving voltage transmission line VLd1, and the third driving voltage transmission line VLd3 may include the same material as the source electrode SE and the drain electrode DE and may be arranged on the same layer (e.g., the first via insulating layer 110) as the source electrode SE and the drain electrode DE. According to some embodiments, each of the first to third transmission lines TL1 to TL3 described with reference to FIGS. 6A and 6B may be formed in the same process as the source electrode SE and the drain electrode DE. For example, each of the first to third transmission lines TL1 to TL3 may include the same material as the source electrode SE and the drain electrode DE and may be arranged on the same layer (e.g., the first via insulating layer 110) as the source electrode SE and the drain electrode DE.

The light-emitting diode LED may be arranged on the pixel circuit layer PCL in the display area DA. The light-emitting diode LED may be electrically connected to the pixel circuit PC arranged between the substrate 100 and the light-emitting diode LED in a direction (e.g., a z direction) perpendicular to the substrate 100. The light-emitting diode LED may be arranged on the second via insulating layer 120. The light-emitting diode LED may emit red, green, or blue light or red, green, blue, or white light. The light-emitting diode LED may be formed by a stack structure of a pixel electrode 210, an intermediate layer 220, and an opposite electrode 230.

The light-emitting diode LED may include an organic light-emitting diode including an organic emission layer. For example, the light-emitting diode LED may include an inorganic light-emitting diode including an inorganic emission layer. A size of the light-emitting diode LED may be micro-scale or nano-scale. For example, the light-emitting diode LED may include a micro-light-emitting diode. For example, the light-emitting diode LED may include a nanorod-light-emitting diode. The nanorod-light-emitting diode may include GaN. According to some embodiments, a color conversion layer may be disposed on the nanorod-light-emitting diode. The color conversion layer may include quantum dots. For example, the light-emitting diode LED may include a quantum dot light-emitting diode including a quantum dot emission layer.

The pixel electrode 210 may be arranged on the second via insulating layer 120. The pixel electrode 210 may be electrically connected to the connection electrode CM through a contact hole of the second via insulating layer 120. According to some embodiments, the pixel electrode 210 may include conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the pixel electrode 210 may include a reflective layer including Ag, Mg, Al, Pt, Pd, Au, Ni, Nd, Ir, Cr, or a compound and mixture thereof. According to some embodiments, the pixel electrode 210 may further include a layer including ITO, IZO, ZnO, or $In_2O_3$ above/below the reflective layer described above. For example, the pixel electrode 210 may have a layered structure including ITO/Ag/ITO layers.

A pixel-defining layer 130 including an opening 130OP exposing a central portion of the pixel electrode 210 may be arranged on the pixel electrode 210. The pixel-defining layer 130 may include an organic insulating material and/or an inorganic insulating material. The opening 130OP of the pixel-defining layer 130 may correspond to one light-emitting diode LED and may define one emission area. The area exposed by the opening 130OP of the pixel-defining layer 130 may be defined as the emission area.

The intermediate layer 220 may be arranged on the pixel-defining layer 130. The intermediate layer 220 may include the emission layer arranged in the opening 130OP of the pixel-defining layer 130. The emission layer may include a high or low molecular-weight organic material emitting certain color light.

A first functional layer and a second functional layer may further be arranged below and above the emission layer, respectively. The first functional layer may include, for example, a hole transport layer HTL and/or a hole injection layer HIL. The second functional layer may be an element arranged above the emission layer. In some embodiments, the second functional layer may be omitted. The second functional layer may include an electron transport layer ETL and/or an electron injection layer EIL. According to some embodiments, the first functional layer and/or the second functional layer may be (a) common layer(s) formed to entirely cover the substrate 100, like the opposite electrode 230 to be described below.

The opposite electrode 230 may include a conductive material having a low work function. For example, the opposite electrode 230 may include a transparent (e.g., semitransparent) layer including Ag, Mg, Al, Pt, Pd, Au, Ni, Nd, Ir, Cr, Li, Ca, or an alloy or a compound thereof. For example, the opposite electrode 230 may further include a layer, such as ITO, IZO, ZnO, or $In_2O_3$, on the transparent (e.g., semitransparent) layer including the material described above.

According to some embodiments, a capping layer may further be arranged on the opposite electrode 230. The capping layer may include LiF, an inorganic material, or/and an organic material.

The encapsulation member 300 may cover the light-emitting diode LED. The encapsulation member 300 may be arranged on the opposite electrode 230. According to some embodiments, the encapsulation member 300 may be arranged in the display area DA. According to some embodiments, the encapsulation member 300 may include at least one inorganic encapsulation layer and at least one organic encapsulation layer. According to some embodiments, the encapsulation member 300 may include a first inorganic encapsulation layer 310, an organic encapsulation layer 320, and a second inorganic encapsulation layer 330 that are sequentially stacked.

The first inorganic encapsulation layer 310 and the second inorganic encapsulation layer 330 may include an inorganic insulating material, such as $SiO_2$, $SiN_x$, SiON, $Al_2O_3$, $TiO_2$, $Ta_2O_5$, $HfO_2$, or ZnO. The first and second inorganic encapsulation layers 310 and 330 may include a single layer or layers including the inorganic insulating material described above.

The organic encapsulation layer 320 may reduce the inner stress of the first inorganic encapsulation layer 310 and/or the second inorganic encapsulation layer 330. The organic encapsulation layer 320 may include a polymer-based material. The polymer-based material may include polyethylene terephthalate, polyethylene naphthalate, polycarbonate, polyimide, polyethylene sulfonate, polyoxymethylene, polyarylate, HMDSO, acryl-based resins (e.g., PMMA, poly acrylic acid, etc.), or an arbitrary combination thereof.

The organic encapsulation layer 320 may be formed by applying a material having flowability and including monomers and making, by using heat or light such as ultraviolet rays, the monomers react to unite to become a polymer. For example, the organic encapsulation layer 320 may be formed by applying a polymer material.

According to some embodiments, in a display apparatus including a first pixel emitting a first color and a second pixel emitting a second color, a repair circuit may be electrically connected to a different light-emitting diode initialization voltage line when the first pixel is defective from when the second pixel is defective. Thus, display quality of the display apparatus may be improved.

According to some embodiments, the repair circuit may be electrically connected to a different compensation capacitor when the first pixel is defective from when the second pixel is defective. Thus, display quality of the display apparatus may be improved. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims and equivalents thereof.

What is claimed is:

1. A display apparatus comprising:

a display area comprising a round corner portion and in which a plurality of pixels, each comprising a pixel circuit and a light-emitting diode, are arranged;

a peripheral area comprising a first side peripheral area adjacent to the display area in a first direction, a second side peripheral area adjacent to the display area in a second direction crossing the first direction, and a corner peripheral area located between the first side peripheral area and the second side peripheral area and adjacent to the round corner portion of the display area, the peripheral area surrounding the display area;

a first repair circuit arranged in the first side peripheral area and a second repair circuit arranged in the corner peripheral area;

a first light-emitting diode initialization voltage line extending in the first direction in the display area and configured to transmit a first light-emitting diode initialization voltage to each of the plurality of pixels; and a second light-emitting diode initialization voltage line extending in the first direction in the display area and configured to transmit a second light-emitting diode initialization voltage to each of the plurality of pixels, wherein the first light-emitting diode initialization voltage line extends from the display area to the first side peripheral area and is electrically connectable to a transistor of the first repair circuit, and wherein the second light-emitting diode initialization voltage line extends from the display area to the first side peripheral area and is electrically connectable to the transistor of the first repair circuit.

2. The display apparatus of claim 1, further comprising a first connection pattern connected to the transistor of the first repair circuit, wherein each of the first light-emitting diode initialization voltage line and the second light-emitting diode initialization voltage line is arranged to overlap with the first connection pattern to be connectable to the first connection pattern.

3. The display apparatus of claim 2, wherein the first light-emitting diode initialization voltage line is at a different layer from the second light-emitting diode initialization voltage line.

4. The display apparatus of claim 3, wherein the first connection pattern is at a different layer from each of the first light-emitting diode initialization voltage line and the second light-emitting diode initialization voltage line.

5. The display apparatus of claim 1, wherein the first repair circuit comprises a first compensation capacitor and a second compensation capacitor that are electrically connectable to the transistor of the first repair circuit.

6. The display apparatus of claim 5, further comprising:

a second connection pattern connected to the transistor of the first repair circuit;

a third connection pattern arranged to overlap with the second connection pattern to be connectable to the second connection pattern, the third connection pattern being connected to the first compensation capacitor; and a fourth connection pattern arranged to overlap with the second connection pattern to be connectable to the second connection pattern, the fourth connection pattern being connected to the second compensation capacitor.

7. The display apparatus of claim 5, further comprising a driving voltage transmission line configured to transmit a driving voltage to each of the plurality of pixels, wherein each of the first compensation capacitor and the second compensation capacitor is electrically connectable to the driving voltage transmission line.

8. The display apparatus of claim 7, further comprising:

a fifth connection pattern connected to the driving voltage transmission line;

a sixth connection pattern arranged to overlap with the fifth connection pattern to be connectable to the fifth connection pattern, the sixth connection pattern being connected to the first compensation capacitor; and a seventh connection pattern arranged to overlap with the fifth connection pattern to be connectable to the fifth connection pattern, the seventh connection pattern being connected to the second compensation capacitor.

9. The display apparatus of claim 1, further comprising:

a first light-emitting diode initialization voltage supply line, at least a portion of which is arranged in the second side peripheral area;

a first transmission line electrically connected to the first light-emitting diode initialization voltage supply line, arranged in the corner peripheral area, and electrically connectable to a transistor of the second repair circuit;

a second light-emitting diode initialization voltage supply line, at least a portion of which is arranged in the second side peripheral area; and a second transmission line electrically connected to the second light-emitting diode initialization voltage supply line, arranged in the corner peripheral area, and electrically connectable to the transistor of the second repair circuit.

10. The display apparatus of claim 9, further comprising:

a first connection line electrically connected to the first transmission line;

a second connection line electrically connected to the second transmission line; and an eighth connection pattern connected to the transistor of the second repair circuit and overlapping with each of the first connection line and the second connection line to be electrically connectable to each of the first connection line and the second connection line.

11. The display apparatus of claim 1, further comprising:

a first light-emitting diode initialization voltage supply line, at least a portion of which is arranged in the second side peripheral area;

a first transmission line electrically connected to the first light-emitting diode initialization voltage supply line, arranged in the corner peripheral area, and electrically connected to a transistor of the second repair circuit; and a second light-emitting diode initialization voltage supply line, at least a portion of which is arranged in the second side peripheral area and supplying a second light-emitting diode initialization voltage to each of the plurality of pixels, wherein the second light-emitting diode initialization voltage supply line is electrically connectable to the first light-emitting diode initialization voltage supply line.

12. The display apparatus of claim 11, further comprising:

a first connection line electrically connecting the first transmission line to the transistor of the second repair circuit; and a ninth connection pattern connected to the second light-emitting diode initialization voltage supply line and arranged to overlap with the first light-emitting diode initialization voltage supply line to be connectable to the first light-emitting diode initialization voltage supply line.

13. A display apparatus comprising:

a display area in which a plurality of pixels each comprising a pixel circuit and a light-emitting diode are arranged;

a peripheral area surrounding the display area;

a repair circuit arranged in the peripheral area;

a first light-emitting diode initialization voltage line extending in a first direction in the display area and configured to transmit a first light-emitting diode initialization voltage to each of the plurality of pixels; and a second light-emitting diode initialization voltage line extending in the first direction in the display area and configured to transmit a second light-emitting diode initialization voltage to each of the plurality of pixels, wherein the first light-emitting diode initialization voltage line extends from the display area to the peripheral area and is electrically connectable to a transistor of the repair circuit, and wherein the second light-emitting diode initialization voltage line extends from the display area to the peripheral area and is connectable to the transistor of the repair circuit.

14. The display apparatus of claim 13, further comprising a first connection pattern arranged in the peripheral area and connected to the transistor of the repair circuit, wherein each of the first light-emitting diode initialization voltage line and the second light-emitting diode initialization voltage line is arranged to overlap with the first connection pattern to be connectable to the first connection pattern.

15. The display apparatus of claim 14, wherein the first light-emitting diode initialization voltage line is on a different layer from the second light-emitting diode initialization voltage line.

16. The display apparatus of claim 15, wherein the first connection pattern is on a different layer from each of the first light-emitting diode initialization voltage line and the second light-emitting diode initialization voltage line.

17. The display apparatus of claim 13, wherein the repair circuit further comprises a first compensation capacitor and a second compensation capacitor that are electrically connectable to the transistor of the repair circuit.

18. The display apparatus of claim 17, further comprising:

a second connection pattern connected to the transistor of the repair circuit;

a third connection pattern arranged to overlap with the second connection pattern to be connectable to the second connection pattern, the third connection pattern being connected to the first compensation capacitor; and a fourth connection pattern arranged to overlap with the second connection pattern to be connectable to the second connection pattern, the fourth connection pattern being connected to the second compensation capacitor.

19. The display apparatus of claim 17, further comprising:

a driving voltage transmission line extending in the first direction and configured to transmit a driving voltage to each of the plurality of pixels, a fifth connection pattern connected to the driving voltage transmission line;

a sixth connection pattern arranged to overlap with the fifth connection pattern to be connectable to the fifth connection pattern, the sixth connection pattern being connected to the first compensation capacitor; and a seventh connection pattern arranged to overlap with the fifth connection pattern to connectable to the fifth connection pattern, the seventh connection pattern being connected to the second compensation capacitor, wherein each of the first compensation capacitor and the second compensation capacitor is electrically connectable to the driving voltage transmission line.

20. An electronic device comprising:

an input module configured to receive input data from a user;

a memory configured to store the input data;

a processor configured to perform computations based on the input data and provide output data; and a display apparatus configured to display an image to the user based, in part, on the input data and the output data, the display apparatus comprising:

a display area comprising a round corner portion and in which a plurality of pixels, each comprising a pixel circuit and a light-emitting diode, are arranged;

a peripheral area comprising a first side peripheral area adjacent to the display area in a first direction, a second side peripheral area adjacent to the display area in a second direction crossing the first direction, and a corner peripheral area located between the first side peripheral area and the second side peripheral area and adjacent to the round corner portion of the display area, the peripheral area surrounding the display area;

a first repair circuit arranged in the first side peripheral area and a second repair circuit arranged in the corner peripheral area;

a first light-emitting diode initialization voltage line extending in the first direction in the display area and configured to transmit a first light-emitting diode initialization voltage to each of the plurality of pixels; and a second light-emitting diode initialization voltage line extending in the first direction in the display area and configured to transmit a second light-emitting diode initialization voltage to each of the plurality of pixels, wherein the first light-emitting diode initialization voltage line extends from the display area to the first side peripheral area and is electrically connectable to a transistor of the first repair circuit, and wherein the second light-emitting diode initialization voltage line extends from the display area to the first side peripheral area and is electrically connectable to the transistor of the first repair circuit.

* * * * *